United States Patent
Yoshida et al.

(10) Patent No.: US 9,397,167 B2
(45) Date of Patent: Jul. 19, 2016

(54) NITRIDE SEMICONDUCTOR WAFER, NITRIDE SEMICONDUCTOR DEVICE, AND METHOD FOR MANUFACTURING NITRIDE SEMICONDUCTOR WAFER

(71) Applicants: Hisashi Yoshida, Kanagawa-ken (JP); Toshiki Hikosaka, Kanagawa-ken (JP); Yoshiyuki Harada, Tokyo (JP); Naoharu Sugiyama, Kanagawa-ken (JP); Shinya Nunoue, Chiba-ken (JP)

(72) Inventors: Hisashi Yoshida, Kanagawa-ken (JP); Toshiki Hikosaka, Kanagawa-ken (JP); Yoshiyuki Harada, Tokyo (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 193 days.

(21) Appl. No.: 13/729,713

(22) Filed: Dec. 28, 2012

(65) Prior Publication Data

US 2014/0084296 A1    Mar. 27, 2014

(30) Foreign Application Priority Data

Sep. 26, 2012  (JP) ................................. 2012-212884

(51) Int. Cl.
*H01L 29/15* (2006.01)
*H01L 29/20* (2006.01)
(Continued)

(52) U.S. Cl.
CPC ........ *H01L 29/2003* (2013.01); *H01L 21/0254* (2013.01); *H01L 21/0262* (2013.01); *H01L 21/02104* (2013.01); *H01L 21/02381* (2013.01);
(Continued)

(58) Field of Classification Search
CPC .................................................. C30B 25/183
USPC ........................................................ 257/76
See application file for complete search history.

(56) References Cited

U.S. PATENT DOCUMENTS 5,786,606 A * 7/1998 Nishio et al. .................. 257/103
6,838,705 B1   1/2005 Tanizawa
(Continued)

FOREIGN PATENT DOCUMENTS

CN    1345468 A    4/2002
CN    1659713 A    8/2005
(Continued)

OTHER PUBLICATIONS

Kasap, Safa et al. "Springer Handbook of Electronic and Photonic Materials", p. 757, SpringerLink (Online service) Imprint: Boston, MA : Springer Science+Business Media, Inc., 2006. ISBN: 9780387291857.*
(Continued)

*Primary Examiner* — Andy Huynh
*Assistant Examiner* — Sitaramarao S Yechuri
(74) *Attorney, Agent, or Firm* — Oblon, McClelland, Maier & Neustadt, L.L.P.

(57) ABSTRACT

A nitride semiconductor wafer includes a silicon substrate, a stacked multilayer unit, a silicon-containing unit, and an upper layer unit. The silicon substrate has a major surface. The stacked multilayer unit is provided on the major surface. The stacked multilayer unit includes N number of buffer layers. The buffer layers include an i-th buffer layer, and an (i+1)-th buffer layer provided on the i-th buffer layer. The i-th buffer layer has an i-th lattice length Wi in a first direction parallel to the major surface. The (i+1)-th buffer layer has an (i+1)-th lattice length W(i+1) in the first direction. A relation that $(W(i+1)-Wi)/Wi \leq 0.008$ is satisfied for all the buffer layers. The silicon-containing unit is provided on the stacked multilayer unit. The upper layer unit is provided on the silicon-containing unit.

20 Claims, 14 Drawing Sheets

(51) Int. Cl.
*H01L 21/02* (2006.01)
*H01L 29/778* (2006.01)
*H01L 29/06* (2006.01)
*H01L 33/00* (2010.01)
*H01L 33/12* (2010.01)

(52) U.S. Cl.
CPC .... *H01L 21/02458* (2013.01); *H01L 21/02505* (2013.01); *H01L 29/0649* (2013.01); *H01L 29/7786* (2013.01); *H01L 33/007* (2013.01); *H01L 33/12* (2013.01)

(56) References Cited

U.S. PATENT DOCUMENTS

| | | | |
|---|---|---|---|
| 2002/0123164 A1* | 9/2002 | Slater et al. | 438/39 |
| 2002/0190259 A1* | 12/2002 | Goetz et al. | 257/79 |
| 2006/0175600 A1 | 8/2006 | Sato et al. | |
| 2009/0032833 A1 | 2/2009 | Nam | |
| 2012/0074385 A1 | 3/2012 | Tak et al. | |
| 2012/0119219 A1 | 5/2012 | Takado et al. | |

FOREIGN PATENT DOCUMENTS

| | | | |
|---|---|---|---|
| JP | 2001-230447 A | | 8/2001 |
| JP | 2001230447 A | * | 8/2001 |
| JP | 2004-524250 | | 8/2004 |
| JP | 2004-289005 A | | 10/2004 |
| JP | 2005-197292 | | 7/2005 |
| JP | 2009-527913 | | 7/2009 |
| JP | 2009-530808 | | 8/2009 |
| JP | 2012-109345 A | | 6/2012 |
| JP | 2012-243871 | | 12/2012 |
| WO | WO 2011/135963 A1 | | 11/2011 |
| WO | WO 2012/089703 A1 | | 7/2012 |

OTHER PUBLICATIONS

Hadis Morkoc, "Handbook of Nitride Semiconductors and Devices", 2008, Wiley-VCH Verlag GmbH & Co. KGaA, Weinheim, ISBN 978-3-527-40837-5 pp. 90, 102, 104.*
Japanese Office Action Issued May 10, 2013 in Patent Application No. 2012-212884 (with English translation).
Combined Office Action and Search Report issued Oct. 10, 2015 in Chinese Patent Application No. 201310331614.3 (with English language translation and English Translation of Category of Cited Documents).
Office Action issued Feb. 3, 2016 in Japanese Patent Application No. 2013-143234 (with English language translation).
Notification of Reasons for Refusal issued Mar. 23, 2016, in Japanese Patent Application No. 2013-210101 (with a machine-generated English translation).

* cited by examiner

|  | SP01 | SP02 | SP03 |
|---|---|---|---|
| t0 (μm) | 525 | 525 | 950 |
| t1 (nm) | 120 | 120 | 120 |
| GT1 (°C) | 1170 | 1170 | 1170 |
| TMA1 (ccm) | 25 | 25 | 25 |
| N1 (lm) | 0.8 | 0.8 | 0.8 |
| GR1 (nm/min) | 6.1 | 6.1 | 6.1 |
| t2 (nm) | 100 | 100 | 100 |
| x2 | 0.517 | 0.713 | 0.557 |
| GT2 (°C) | 1140 | 1140 | 1140 |
| TMA2 (ccm) | 50 | 50 | 50 |
| TMG2 (ccm) | 11.0 | 5.1 | 9.8 |
| N2 (lm) | 2.5 | 2.5 | 2.5 |
| GR2 (nm/min) | 12.2 | 12.2 | 12.2 |
| t3 (nm) | 200 | 200 | 215 |
| x3 | 0.292 | 0.458 | 0.309 |
| GT3 (°C) | 1140 | 1140 | 1140 |
| TMA3 (ccm) | 30 | 50 | 30 |
| TMG3 (ccm) | 16.8 | 12 | 16.8 |
| N3 (lm) | 2.5 | 2.5 | 2.5 |
| GR3 (nm/min) | 20.8 | 20.8 | 20.8 |
| t4 (nm) | 250 | 250 | 250 |
| x4 | 0.158 | 0.252 | 0.162 |
| GT4 (°C) | 1140 | 1140 | 1140 |
| TMA4 (ccm) | 15.1 | 25 | 15.1 |
| TMG4 (ccm) | 20.4 | 18 | 20.4 |
| N4 (lm) | 2.5 | 2.5 | 2.5 |
| GR4 (nm/min) | 22.7 | 22.7 | 22.7 |
| t5 (nm) | 365 | 400 | 400 |
| GT5 (°C) | 1230 | 1230 | 1230 |
| TMG5 (ccm) | 47 | 47 | 47 |
| N5 (lm) | 20 | 20 | 20 |
| GR5 (nm/min) | 36.3 | 36.3 | 36.3 |

FIG. 5

|  | SP01 | SP02 | SP03 |
|---|---|---|---|
| CF1 (km$^{-1}$) | 18.3 | 16.4 | 4.4 (14.4) |
| LM2 (%) | 0.46 | 0.12 | 0.30 |
| SR2 | 0.39 | 0.18 | 0.28 |
| CF2a (km$^{-1}$) | −20.7 | −9.9 | −5.5 (−18.1) |
| CF2 (km$^{-1}$) | −20.7 | −9.9 | −5.5 (−18.1) |
| LM3 (%) | 0.66 | 0.55 | 0.80 |
| SR3 | 0.52 | 0.46 | 0.58 |
| CF3a (km$^{-1}$) | −26.9 | −22.6 | −7.9 (−25.8) |
| CF3 (km$^{-1}$) | −41.1 | −33.4 | −11.8 (−38.5) |
| LM4 (%) | 0.34 | 0.47 | 0.38 |
| SR4 | 0.37 | 0.41 | 0.41 |
| CF4a (km$^{-1}$) | −13.9 | −17.9 | −4.1 (−13.3) |
| CF4 (km$^{-1}$) | −33.1 | −35.9 | −9.1 (−29.8) |
| LM5 (%) | 0.63 | 0.96 | 0.57 |
| SR5 | 0.65 | 0.74 | 0.60 |
| CF5a (km$^{-1}$) |  | −9.4 | −6.9 (−22.6) |
| CF5 (km$^{-1}$) |  | −18.0 | −13.4 (−44.0) |
| LMt (%) | 2.10 | 2.12 | 2.07 |
| CFa (km$^{-1}$) |  | −59.7 | −24.4 (−79.8) |
| CFt (km$^{-1}$) |  | −97.2 | −39.8 (−130.4) |

FIG. 7

NITRIDE SEMICONDUCTOR WAFER, NITRIDE SEMICONDUCTOR DEVICE, AND METHOD FOR MANUFACTURING NITRIDE SEMICONDUCTOR WAFER

CROSS-REFERENCE TO RELATED APPLICATIONS

This application is based upon and claims the benefit of priority from the prior Japanese Patent Application No. 2012-212884, filed on Sep. 26, 2012; the entire contents of which are incorporated herein by reference.

FIELD

Embodiments described herein relate generally to a nitride semiconductor wafer, a nitride semiconductor device, and a method for manufacturing the nitride semiconductor wafer.

BACKGROUND

There are nitride semiconductor wafers in which a semiconductor layer including nitride semiconductor is formed on a silicon substrate. Nitride semiconductor wafers are used in manufacturing e.g. light emitting diodes (LED), high speed electronic devices, or power devices. Nitride semiconductor wafers have the problem of being prone to cracks occurring in the semiconductor layer during manufacturing due to difference between the thermal expansion coefficient of the silicon substrate and the thermal expansion coefficient of the semiconductor layer. There is an approach for suppressing the occurrence of cracks by applying compressive stress to the nitride semiconductor layer. However, applying compressive stress to the nitride semiconductor layer makes it difficult to reduce threading dislocations.

BRIEF DESCRIPTION OF THE DRAWINGS

FIG. 5 is a table showing the characteristics of the nitride semiconductor wafer according to the first embodiment;

FIG. 7 is a table showing the characteristics of the nitride semiconductor wafer according to the first embodiment;

DETAILED DESCRIPTION

Figure 1:
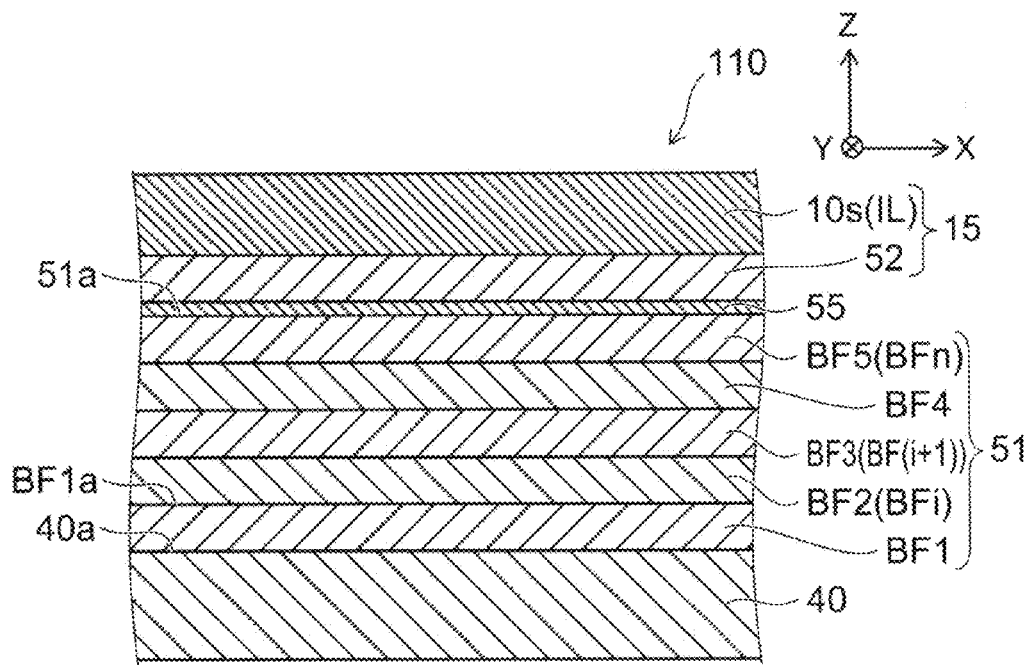
FIG. 1 is a schematic sectional view showing a nitride semiconductor wafer according to the first embodiment.

According to one embodiment, a nitride semiconductor wafer includes a silicon substrate, a stacked multilayer unit, a silicon-containing unit, and an upper layer unit. The silicon substrate has a major surface. The stacked multilayer unit is provided on the major surface. The stacked multilayer unit includes N number of buffer layers stacked in a stacking direction perpendicular to the major surface. The buffer layers include a nitride semiconductor. N is not less than two and not more than nine. The buffer layers include an i-th buffer layer (i being an integer of 1 or more and less than N), and an (i+1)-th buffer layer provided on the i-th buffer layer. The i-th buffer layer has an i-th lattice length Wi in a first direction parallel to the major surface. The (i+1)-th buffer layer has an (i+1)-th lattice length W(i+1) in the first direction. A relation that (W(i+1)−Wi)/Wi≤0.008 is satisfied for all the buffer layers. The silicon-containing unit is provided on the stacked multilayer unit and contains silicon. The upper layer unit is provided on the silicon-containing unit and includes a nitride semiconductor.

According to another embodiment, a nitride semiconductor device includes a stacked multilayer unit, a silicon-containing unit, a upper buffer layer, and a functional layer. The stacked multilayer unit is formed on a major surface of a silicon substrate. The stacked multilayer unit includes N number of buffer layers stacked in a stacking direction perpendicular to the major surface. The buffer layers include a nitride semiconductor. N is not less than two and not more than nine. The buffer layers include an i-th buffer layer (i being an integer of 1 or more and less than N), and an (i+1)-th buffer layer provided on the i-th buffer layer. The i-th buffer layer has an i-th lattice length Wi in a first direction parallel to the major surface. The (i+1)-th buffer layer has an (i+1)-th lattice length W(i+1) in the first direction. A relation that (W(i+1)≤Wi)/Wi≤0.008 is satisfied for all the buffer layers. The silicon-containing unit is provided on the stacked multilayer unit and contains silicon. The upper buffer layer is provided on the silicon-containing unit and includes a nitride semiconductor. The functional layer is provided on the upper buffer layer and includes a nitride semiconductor. The functional layer includes an impurity-containing layer includes an impurity. An impurity concentration in the impurity-containing layer is higher than an impurity concentration in the upper buffer layer.

According to another embodiment, a method is disclosed for manufacturing a nitride semiconductor wafer. The method can include forming a stacked multilayer unit on a major surface of a silicon substrate. The stacked multilayer unit includes N number of buffer layers stacked in a stacking direction perpendicular to the major surface. The buffer layers include a nitride semiconductor. N is not less than two and not more than nine. The buffer layers include an i-th buffer layer (i being an integer of 1 or more and less than N), and an (i+1)-th buffer layer provided on the i-th buffer layer. The i-th buffer layer has a i-th lattice length Wi in a first direction parallel to the major surface. The (i+1)-th buffer layer has a (i+1)-th lattice length W(i+1) in the first direction. A relation that $(W(i+1) \le Wi)/Wi \le 0.008$ is satisfied for all the buffer layers. The method can include forming a silicon-containing unit containing silicon on the stacked multilayer unit. In addition, the method can include forming an upper layer unit including a nitride semiconductor on the silicon-containing unit.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

The nitride semiconductor wafer 110 according to the embodiment is used in manufacturing nitride semiconductor devices such as semiconductor light emitting devices, semiconductor light receiving devices, or electronic devices. The semiconductor light emitting devices include e.g. light emitting diodes (LED) and laser diodes (LD). The semiconductor light receiving devices include e.g. photodiodes (PD). The electronic devices include e.g. high electron mobility transistors (HEMT), heterojunction bipolar transistors (HBT), field effect transistors (FET), and Schottky barrier diodes (SBD).

FIG. 1 is a schematic sectional view illustrating a nitride semiconductor wafer according to the first embodiment.

As shown in FIG. 1, the nitride semiconductor wafer 110 according to the embodiment includes a silicon substrate 40, a first buffer unit 51 (stacked multilayer unit), a silicon-containing unit 55, and an upper layer unit 15.

The silicon substrate 40 has a major surface 40a. The first buffer unit 51 is provided on the major surface 40a. The silicon-containing unit 55 is provided on the first buffer unit 51. The silicon-containing unit 55 contains silicon. The upper layer unit 15 is provided on the silicon-containing unit 55. The upper layer unit 15 includes nitride semiconductor. The upper layer unit 15 includes at least one of a second buffer unit 52 (an upper buffer layer) and a functional layer 10s. The second buffer unit 52 is provided on the silicon-containing unit 55. The second buffer unit 52 includes nitride semiconductor. The functional layer 10s is provided on the second buffer unit 52. The functional layer 10s includes nitride semiconductor. The functional layer 10s includes an impurity-containing layer IL including impurity. The impurity concentration in the impurity-containing layer IL is higher than the impurity concentration in the second buffer unit 52. The second buffer unit 52 may be e.g. non-doped.

Here, the stacking direction from the silicon substrate 40 toward the functional layer 10s is referred to as Z-axis direction. One direction perpendicular to the Z-axis direction is referred to as X-axis direction. The direction perpendicular to the Z-axis direction and the X-axis direction is referred to as Y-axis direction.

In this description, the term "stacked" includes not only the case of being stacked in contact with each other, but also the case of being stacked with another layer interposed in between. The term "provided on" includes not only the case of being provided in direct contact, but also the case of being provided with another layer interposed in between.

The first buffer unit 51 includes N number of buffer layers from a first buffer layer BF1 to an n-th buffer layer BFn, where N is an integer of 2 or more and 9 or less. Namely, a number of the buffer layers are not less than two and not more than nine. The first buffer layer BF1 has a first surface BF1a parallel to the major surface 40a. The i-th buffer layer BFi of the first buffer layer BF1 to the n-th buffer layer BFn has a lattice length Wi in a first direction parallel to the first surface BF1a of the first buffer layer BF1, where i is an integer of 1 or more and less than N. For example, the first buffer layer BF1 is a lower most buffer layer closest to the silicon substrate 40. The n-th buffer layer BFn is an upper most buffer layer closest to the silicon-containing unit 55.

The (i+1)-th buffer layer BF(i+1) provided on the i-th buffer layer BFi has a lattice length W(i+1) in the first direction. For instance, the (i+1)-th buffer layer BF(i+1) is in contact with the i-th buffer layer BFi.

All of two adjacent buffer layers (namely, the i-th buffer layer BFi and the (i+1)-th buffer layer BF(i+1)) of the first buffer layer BFi to the n-th buffer layer BFn satisfy the relation of $(W(i+1)-Wi)/Wi \le 0.008$. The relation that $(W(i+1)-Wi)/Wi \le 0.008$ is satisfied for all the buffer layers. As described later, $(W(i+1)-Wi)/Wi$ is preferably 0.003 or more. The relation that $0.003 \le (W(i+1)-Wi)/Wi$ is satisfied for all the buffer layers.

For instance, in the case where the first surface BF1a of the first buffer layer BF1 is a c-plane, the first direction is e.g. the a-axis direction. For instance, the lattice length Wi is a lattice length in the a-axis direction in the i-th buffer layer BFi.

In the following, for simplicity of description, it is assumed that the first direction is the a-axis direction. However, in the embodiments, the first direction can be an arbitrary direction parallel to the first surface BF1a (X-Y plane). The following description is applicable to the case where the a-axis direction is an arbitrary direction parallel to the first surface BF1a (X-Y plane).

The first buffer layer BF1 to the n-th buffer layer BFn include nitride semiconductor. The first buffer layer BF1 includes e.g. $Al_{x1}Ga_{1-x1}N$ ($0<x1\le1$). The n-th buffer layer BFn includes e.g. $Al_{xn}Ga_{1-xn}N$ ($0\le xn<x1$). The i-th buffer layer BFi between the first buffer layer BF1 and the n-th buffer layer BFn includes e.g. $Al_{xi}Ga_{1-xi}N$ ($xn<xi<x1$). The first buffer layer BF1 is e.g. an AlN layer. The n-th buffer layer BFn is e.g. an AlGaN layer or a GaN layer. The i-th buffer layer BFi between the first buffer layer BF1 and the n-th buffer layer BFn is e.g. an AlGaN layer. In the case where the n-th buffer layer BFn is an AlGaN layer, the Al composition ratio of the AlGaN layer of the i-th buffer layer BFi between the first buffer layer BF1 and the n-th buffer layer BFn is made higher than the Al composition ratio of the AlGaN layer of the n-th buffer layer BFn.

The lattice mismatch LM in the first direction (e.g., a-axis direction) between the i-th buffer layer BFi and the (i+1)-th buffer layer BF(i+1) can be determined by equation (1).

$$LM = (W(i+1)-Wi)/Wi \times 100 (\%) \tag{1}$$

Hereinbelow, LMc denotes lattice mismatch in an a-axis direction between AlN layer and GaN layer obtained from physical properties, LMt denotes lattice mismatch in the a-axis direction between AlN layer and GaN layer obtained from experiments, and LMx denotes lattice mismatch in the a-axis direction between the adjacent buffer layers in the first buffer layer BF1 through n-th buffer layer BFn.

For instance, for the first buffer layer BF1 to the n-th buffer layer BFn, the lattice mismatches LMx in the a-axis direction of the two adjacent buffer layers all satisfy the relation of 0.3%≤LMx≤0.8%.

It is assumed that the first buffer layer BF1 is an AlN layer, and the n-th buffer layer BFn is a GaN layer. The lattice mismatch LMc in the a-axis direction obtained from physical properties between the AlN layer and the GaN layer is 2.5%. The lattice mismatch LMt in the a-axis direction between AlN layer and GaN layer obtained from the experiments is, e.g. not less than 1.9% and not more than 2.5%. That is, the lattice mismatch LMt in the first direction between the first buffer layer BF1 and the n-th buffer layer BFn is not less than 1.9% and not more than 2.5%. The first buffer layer BF1 has a first lattice length W1 (a lower most lattice length). The n-th buffer layer BFn has a n-th lattice length Wn (an upper most lattice length). The first buffer layer BF1 and the n-th buffer layer BFn satisfy a relation of 0.019≤(Wn−W1)/Wn≤0.025.

It is assumed that the lattice mismatch LMx in the a-axis direction of two adjacent buffer layers in the first buffer layer BF1 to the n-th buffer layer BFn is constant. At this time, in the case of the lattice mismatch LMx being 0.3%, because 0.3×8=2.4, the number of AlGaN layers provided between the first buffer layer BF1 of the AlN layer and the n-th buffer layer BFn of the GaN layer is 7.

That is, the maximum of the N number of buffer layers provided in the first buffer unit 51 is 9, obtained by adding the AlN layer and the GaN layer to the above number 7 of AlGaN layers. The minimum value of the N number is e.g. 2 of the AlN layer and the AlGaN layer on the AlN layer. Thus, the N number is an integer of 2 or more and 9 or less.

In the case of forming an AlN layer on the silicon substrate 40, the lattice in the a-axis direction of the AlN layer is expanded due to the lattice constant difference between AlN and silicon. In the case of forming a GaN layer on an AlGaN layer, the lattice in the a-axis direction of the GaN layer is compressed due to the lattice length difference between GaN and AlGaN. Thus, the lattice mismatch LMt in the a-axis direction between the AlN layer and the GaN layer tends to become smaller than 2.5%. An experiment was performed to fabricate a plurality of nitride semiconductor wafer samples and to measure the lattice mismatch LMt in the a-axis direction between the AlN layer and the GaN layer. According to this experiment, the average of the lattice mismatch LMt was approximately 2.1%. That is, the actual lattice mismatch LMt in the a-axis direction between the AlN layer and the GaN layer is e.g. 2.0% or more and 2.2% or less.

The lattice mismatch LMx in the a-axis direction of the two adjacent layers in the first buffer layer BF1 to the n-th buffer layer BFn is adjusted by changing the Al composition ratio. From the first buffer layer BF1 toward the n-th buffer layer BFn, the Al composition ratio is gradually decreased. That is, the Al composition ratio in the (i+1)-th buffer layer BF(i+1) is lower than the Al composition ratio in the i-th buffer layer BFi.

In the following description, it is assumed that the N number of layers provided in the first buffer unit 51 is 5.

That is, the first buffer unit 51 includes the first buffer layer BF1 to the fifth buffer layer BF5. The first buffer layer BF1 is provided on the silicon substrate 40. The second buffer layer BF2 is provided on the first buffer layer BF1. The third buffer layer BF3 is provided on the second buffer layer BF2. The fourth buffer layer BF4 is provided on the third buffer layer BF3. The fifth buffer layer BF5 is provided on the fourth buffer layer BF4. In this example, the fifth buffer layer BF5 is the n-th buffer layer BFn.

The first buffer layer BF1 includes e.g. $Al_{x1}Ga_{1-x1}N$ (0<x1≤1). The second buffer layer BF2 includes e.g. $Al_{x2}Ga_{1-x2}N$ (0<x2<x1). The third buffer layer BF3 includes e.g. $Al_{x3}Ga_{1-x3}N$ (0<x3<x2). The fourth buffer layer BF4 includes e.g. $Al_{x4}Ga_{1-x4}N$ (0<x4<x3). The fifth buffer layer BF5 includes e.g. $Al_{x5}Ga_{1-x5}N$ (0≤x5<x4). The composition ratios x1-x5 are in the relation of x1>x2>x3>x4>x5. The nitride semiconductor wafer 110 is configured so that e.g. x1=1, x2=0.5, x3=0.3, x4=0.15, and x5=0.

For instance, the second buffer layer BF2 is in contact with the first buffer layer BF1. The third buffer layer BF3 is in contact with the second buffer layer BF2. The fourth buffer layer BF4 is in contact with the third buffer layer BF3. The fifth buffer layer BF5 is in contact with the fourth buffer layer BF4.

The first buffer layer to the fifth buffer layer BF5 have lattice lengths in the first direction (e.g., a-axis direction), respectively, i.e., first to fifth lattice lengths W1-W5, respectively.

The second buffer layer BF2 and the first buffer layer BF1 satisfy, e.g. the relation of 0.003≤(W2−W1)/W1≤0.008. The third buffer layer BF3 and the second buffer layer BF2 satisfy, e.g. the relation of 0.003≤(W3−W2)/W2≤0.008. The fourth buffer layer BF4 and the third buffer layer BF3 satisfy the relation of 0.003≤(W4−W3)/W3≤0.008. The fifth buffer layer BF5 and the fourth buffer layer BF4 satisfy the relation of 0.003≤(W5−W4)/W4≤0.008.

The second buffer unit 52 includes e.g. $Al_{x0}Ga_{1-x0}N$ (0≤x0<1). The second buffer unit 52 is e.g. a non-doped GaN layer. The second buffer unit 52 is not limited to a GaN layer but may be e.g. an AlGaN layer. The second buffer unit 52 may be e.g. a stacked unit including an AlGaN layer provided on a silicon-containing unit 55 and a GaN layer provided on the AlGaN layer. The second buffer unit 52 may be e.g. a stacked unit stacked with a plurality of AlGaN layers different in Al composition ratio. In the following description, it is assumed that the second buffer unit 52 is a GaN layer. That is, in this example, the Al composition ratio x0 of the second buffer unit 52 is 0. The thickness of the second buffer unit 52 is e.g. 250 nm or more and 3000 nm or less.

Figure 2:
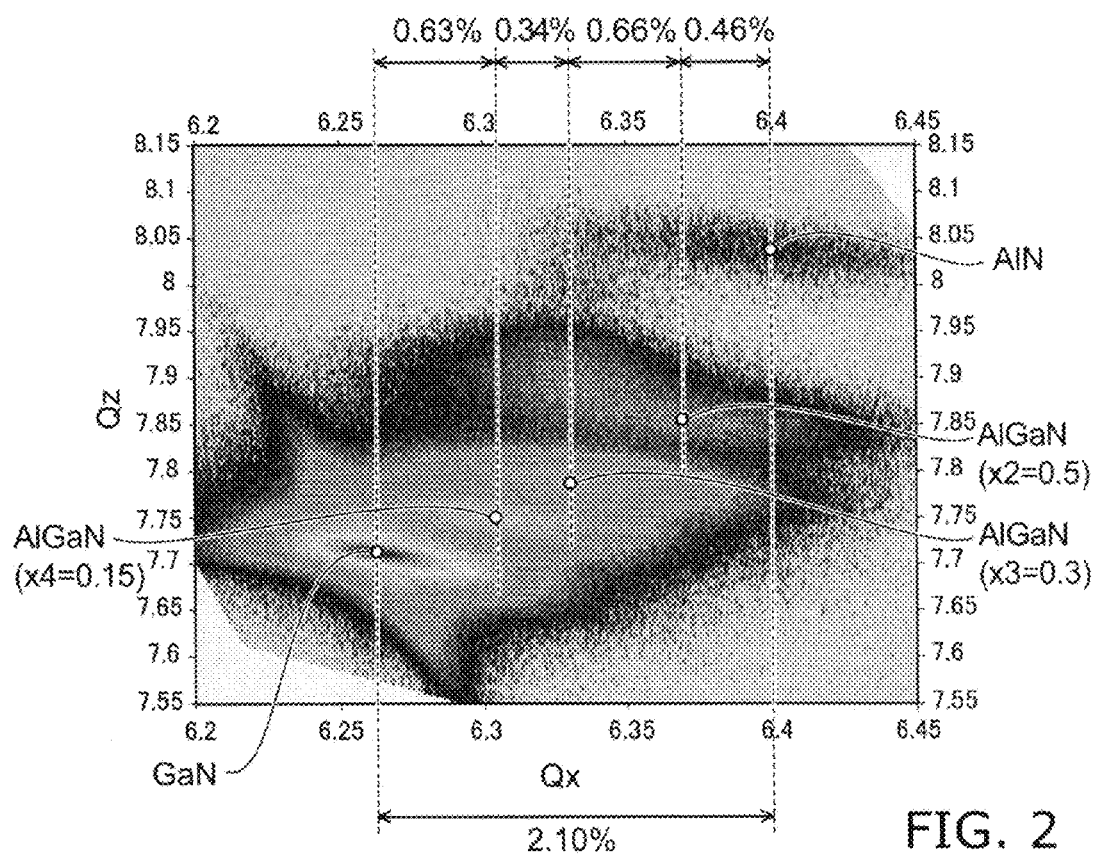
FIG. 2 is a reciprocal lattice space mapping showing the characteristics of the nitride semiconductor wafer according to the first embodiment.

FIG. 2 is a reciprocal lattice space mapping illustrating the characteristics of the nitride semiconductor wafer according to the first embodiment.

In FIG. 2, the horizontal axis represents the inverse Qx of the lattice constant in the <11-20> direction. The vertical axis represents the inverse Qz of the lattice constant in the <0004> direction.

FIG. 2 shows the result of measuring the reciprocal lattice space mapping of the nitride semiconductor wafer 110 (x0=0, x1=1, x2=0.5, x3=0.3, x4=0.15, and x5=0).

As shown in FIG. 2, for the lattice mismatch LMx in the a-axis direction of two adjacent buffer layers in the Z-axis direction are 0.46%, 0.66%, 0.34%, and 0.63%. Thus, in the nitride semiconductor wafer 110, the lattice mismatches in the a-axis direction in the adjacent buffer layers all satisfy the relation of 0.3%≤LMx≤0.8%.

Thus, in the nitride semiconductor wafer 110 according to the embodiment, for instance, the lattice mismatch LMt between the AlN layer and the GaN layer is divided by a plurality of AlGaN layers so that the lattice mismatches LMx in the a-axis direction between adjacent buffer layers in the Z-axis direction satisfy the relation of 0.3%≤LM≤0.80%.

Figure 3:
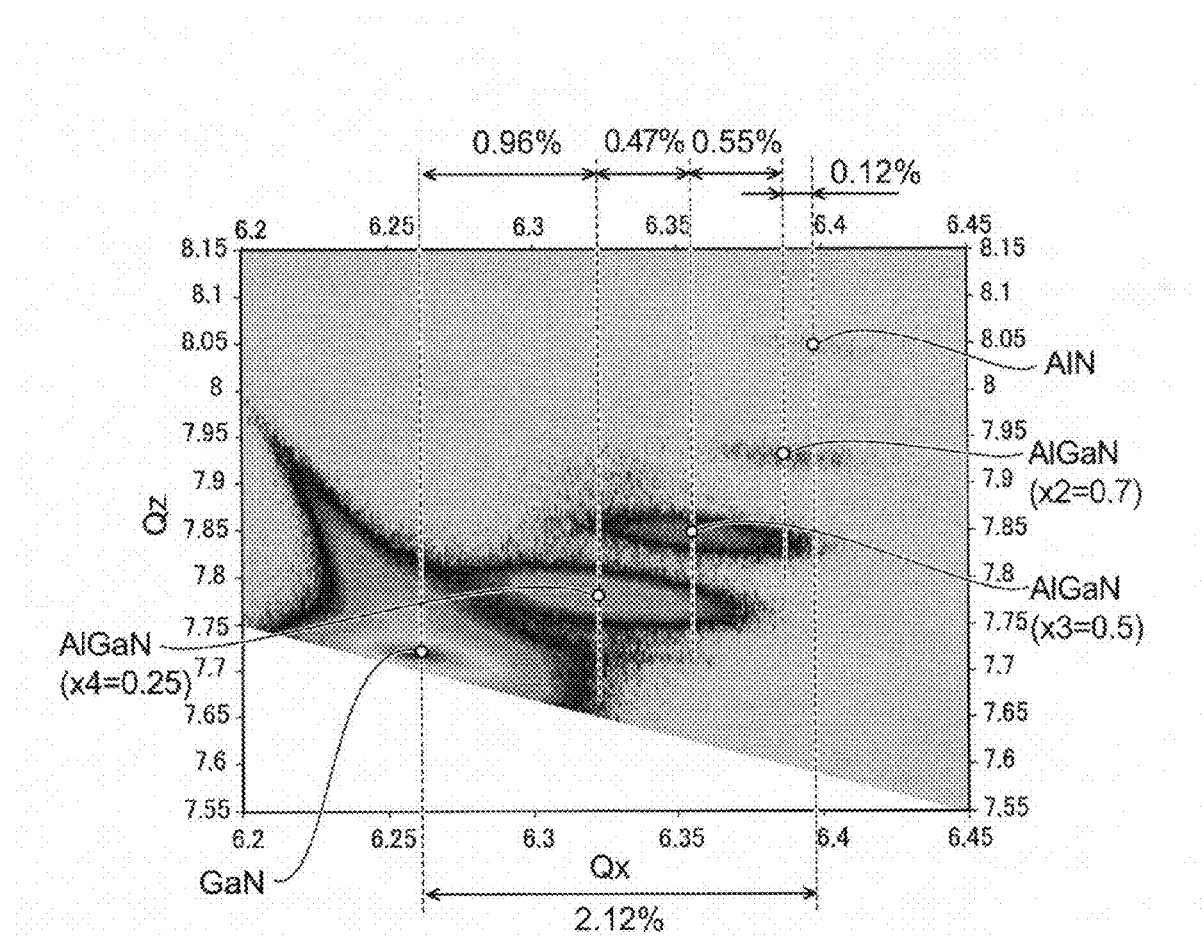
FIG. 3 is a reciprocal lattice space mapping showing the characteristics of a reference example.

FIG. 3 is a reciprocal lattice space mapping illustrating the characteristics of a reference example.

FIG. 3 shows the result of measuring the reciprocal lattice space mapping in the following reference example. In the reference example, a plurality of AlGaN layers are provided between the AlN layer and the GaN layer, the Al composition ratio is equally distributed among the plurality of AlGaN layers.

In the reference example illustrated in FIG. 3, Al composition ratios are x0=0, x1=1, x2=0.7, x3=0.5, x4=0.25, and x5=0.

As shown in FIG. 3, in the reference example, the lattice mismatch LMx in the a-axis direction of adjacent buffer layers in the Z-axis direction are 0.12%, 0.55%, 0.47%, and 0.96%. Thus, the lattice mismatch LMx in the a-axis direction between the first buffer layer BF1 and the second buffer layer BF2 is 0.12%, which is less than 0.3%. Furthermore, the lattice mismatch LMx in the a-axis direction between the fourth buffer layer BF4 and the fifth buffer layer BF5 is 0.96%, which is greater than 0.8%.

In the reference example, a plurality of AlGaN layers equally distributing the Al composition ratio is provided between the AlN layer and the GaN layer. Such configuration results in an excessively large lattice mismatch LMx in the a-axis direction and an excessively small lattice mismatch LMx in the a-axis direction between adjacent buffer layers in the Z-axis direction.

In the nitride semiconductor wafer 110 according to the embodiment, the first buffer layer BF1 to n-th buffer layer BFn are configured so that the lattice mismatch LMx in the a-axis direction of two adjacent buffer layers does not become excessively large and excessively small. In this example, the Al composition ratio is set so that the lattice mismatches LMx all satisfy the relation of 0.3%≤LM≤0.8%.

The thickness (length along the Z-axis direction) of the silicon-containing unit 55 is e.g. 0.3 atomic layers or more and 2.0 atomic layers or less, favorably 0.5 atomic layers or more and 1.4 atomic layers or less. The silicon concentration in the silicon-containing unit 55 is e.g. $6.2 \times 10^{19}$ atoms/cm$^3$ or more and $4.0 \times 10^{20}$ atoms/cm$^3$ or less, favorably $1.0 \times 10^{20}$ atoms/cm$^3$ or more and $2.8 \times 10^{20}$ atoms/cm$^3$ or less. The silicon-containing unit 55 is e.g. island-shaped. The silicon-containing unit 55 is e.g. discontinuous on the upper surface 51a of the first buffer unit 51. A part of the second buffer unit 52 contacts the first buffer unit 51 (the n-th buffer unit BFn). The silicon-containing unit 55 may contain e.g. SiN.

The first buffer unit 51 may include a region having high silicon concentration near the interface with the second buffer unit 52. In the first buffer unit 51, this portion having high silicon concentration may be regarded as the silicon-containing unit 55, and the portion having low silicon concentration may be regarded as the first buffer unit 51. The second buffer unit 52 may include a region having high silicon concentration near the interface with the first buffer unit 51. In the second buffer unit 52, this portion having high silicon concentration may be regarded as the silicon-containing unit 55, and the portion having low silicon concentration may be regarded as the second buffer unit 52.

FIG. 4A to FIG. 4D are electron microscopy images illustrating part of the nitride semiconductor wafer according to the first embodiment.

FIG. 4A to FIG. 4D are SEM (scanning electron microscopy) images of samples. In these samples, a silicon-containing unit 55 is formed on a first buffer unit 51, and then GaN constituting part of a second buffer unit 52 is formed on the silicon-containing unit 55.

Figure 4A:
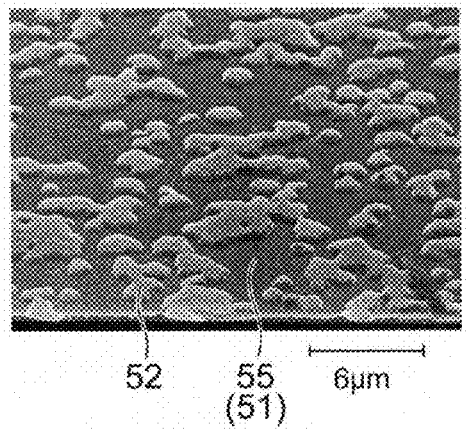
FIG. 4A to FIG. 4D are electron microscopy images showing part of the nitride semiconductor wafer according to the first embodiment.

In the sample of FIG. 4A, in forming the silicon-containing unit 55, SiH$_4$ (monosilane) at a flow rate of 350 lm (liter/minute) is supplied for 3 minutes at 1040° C. In forming the second buffer unit 52, NH$_3$ (ammonia) at a flow rate of 40 lm and TMGa (trimethylgallium) at a flow rate of 56.4 ccm (cc/miniute) are supplied for 5 minutes at 1090° C. It is seen that the second buffer unit 52 is island-shaped crystal with a height of 150 nm to 250 nm.

Figure 4B:
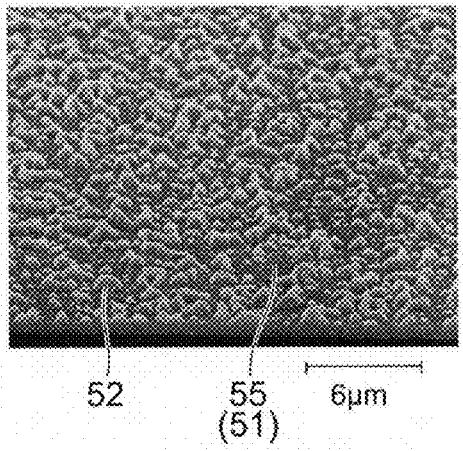

FIG. 4B is a magnified photograph taking the same sample as in FIG. 4A at higher magnification.

Figure 4C:
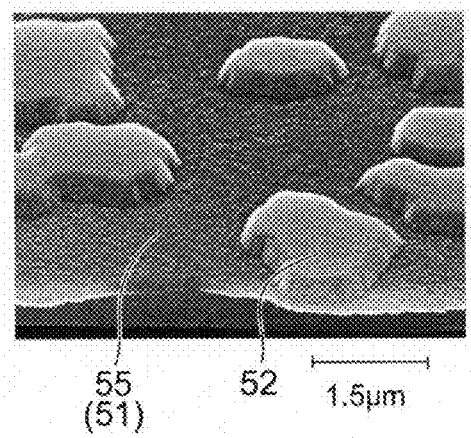

In the sample of FIG. 4C, in forming the silicon-containing unit 55, SiH$_4$ at a flow rate of 350 lm is supplied for 8 minutes at 1040° C. In forming the second buffer unit 52, NH$_3$ at a flow rate of 40 lm and TMGa at a flow rate of 56.4 ccm are supplied for 5 minutes at 1090° C. It is seen that the second buffer unit 52 is island-shaped crystal with a height of 200 nm to 600 nm.

That is, the thickness of the silicon-containing unit 55 of the sample of FIG. 4C is thicker than the thickness of the silicon-containing unit 55 of the sample of FIG. 4A.

Figure 4D:
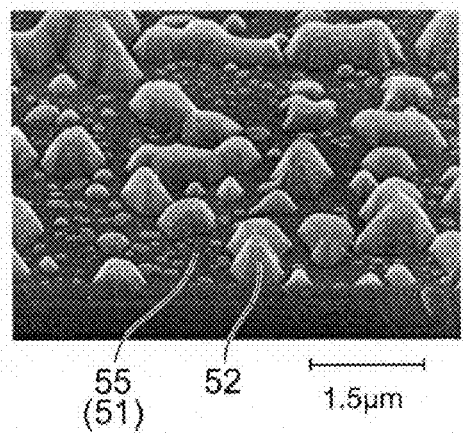

FIG. 4D is a magnified photograph taking the same sample as in FIG. 4C at higher magnification.

FIG. 4A to FIG. 4D show the silicon-containing unit 55 and the growing GaN layer of the second buffer unit 52 provided like islands on the silicon-containing unit 55. However, the thickness of the silicon-containing unit 55 is sufficiently smaller than the resolution of SEM. Thus, the silicon-containing unit 55 is difficult to observe by SEM. Hence, the portion imaged as a foundation can also be regarded as the first buffer unit 51. Furthermore, in the case where the silicon-containing unit 55 is island-shaped, the portion imaged as a foundation includes both the first buffer unit 51 and the silicon-containing unit 55.

As shown in FIG. 4A to FIG. 4D, by providing a silicon-containing unit 55 on the first buffer unit 51, the degree of growth of the GaN layer (nitride semiconductor layer) formed on the first buffer unit 51 is changed. That is, the silicon-containing unit 55 affects the film quality of the nitride semiconductor layer (upper layer unit 15) formed thereon.

The inventors performed various experiments changing the growth condition of e.g. the first buffer unit 51 and the silicon-containing unit 55. Thus, the inventors have found that cracks can be suppressed and the dislocation density can be reduced in the configuration of the nitride semiconductor wafer 110 according to the embodiment.

The presence or absence of the silicon-containing unit 55 can be determined by e.g. SIMS (secondary ion mass spectrometry). For instance, as a result of analysis using SIMS, if silicon is detected in the region between the first buffer unit 51 and the second buffer unit 52, it can be determined that a silicon-containing unit 55 is provided therein.

In the following, the result of experiments on the nitride semiconductor wafer originally performed by the inventors is described.

FIG. 5 is a table illustrating the characteristics of the nitride semiconductor wafer according to the first embodiment.

FIG. 5 shows the growth condition of the first buffer layer BF1 to the fifth buffer layer BF5 of three samples, i.e., the first sample SP01 to the third sample SP03. In the experiment, based on the growth condition shown in FIG. 5, the first sample SP01 to the third sample SP03 are fabricated and characterized.

FIG. 5 shows the following experimental condition:

The thickness t0 (μm) of the silicon substrate 40, and the thickness t1 (nm), t2 (nm), t3 (nm), t4 (nm), and t5 (nm) of the first buffer layer to the fifth buffer layer BF5, respectively, The growth temperature GT1 (° C.), growth temperature GT2 (° C.), growth temperature GT3 (° C.), growth temperature GT4 (° C.), and growth temperature GT5 (° C.) of the first buffer layer BF1 to the fifth buffer layer BF5, respectively, The flow rate TMA1 (ccm, cc/minute), TMA2 (ccm), TMA3 (ccm), TMA4 (ccm), and TMA5 (ccm) of trimethylaluminum (TMA) gas of the first buffer layer BF1 to the fifth buffer layer BF5, respectively, The flow rate N1 (lm, liter/minute), flow rate N2 (lm), flow rate N3 (lm), flow rate N4 (lm), and flow rate N5 (lm) of ammonia ($NH_3$) gas of the first buffer layer BF1 to the fifth buffer layer BF5, respectively, The growth rate GR1 (nm/minute), growth rate GR2 (nm/minute), growth rate GR3 (nm/minute), growth rate GR4 (nm/minute), and growth rate GR5 (nm/minute) of the first buffer layer BF1 to the fifth buffer layer BF5, and The Al composition ratio x2, x3, and x4 of the second buffer layer BF2 to the fifth buffer layer BF5, respectively.

In this experiment, the Al composition ratio x1 in the first buffer layer BF1 is 1, and the Al composition ratio x5 in the fifth buffer layer BF5 is 0.

The growth rate GR1 to the growth rate GR5 are determined by dividing the film thickness by the growth time.

If the first buffer layer BF1 is formed on the silicon substrate 40, the silicon substrate 40 (nitride semiconductor wafer) is warped due to the lattice constant difference in the first direction between silicon and the first buffer layer BF1. Likewise, if the (i+1)-th buffer layer BF(i+1) is formed on the i-th buffer layer BFi, the silicon substrate 40 is warped due to the lattice constant difference in the first direction between the i-th buffer layer BFi and the (i+1)-th buffer layer BF(i+1). In the first sample SP01 to the third sample SP03, the curvature change (warpage) of the silicon substrate 40 in response to film formation of the first buffer layer BF1 to the fifth buffer layer BF5 is measured by an optical monitor.

Figure 6:
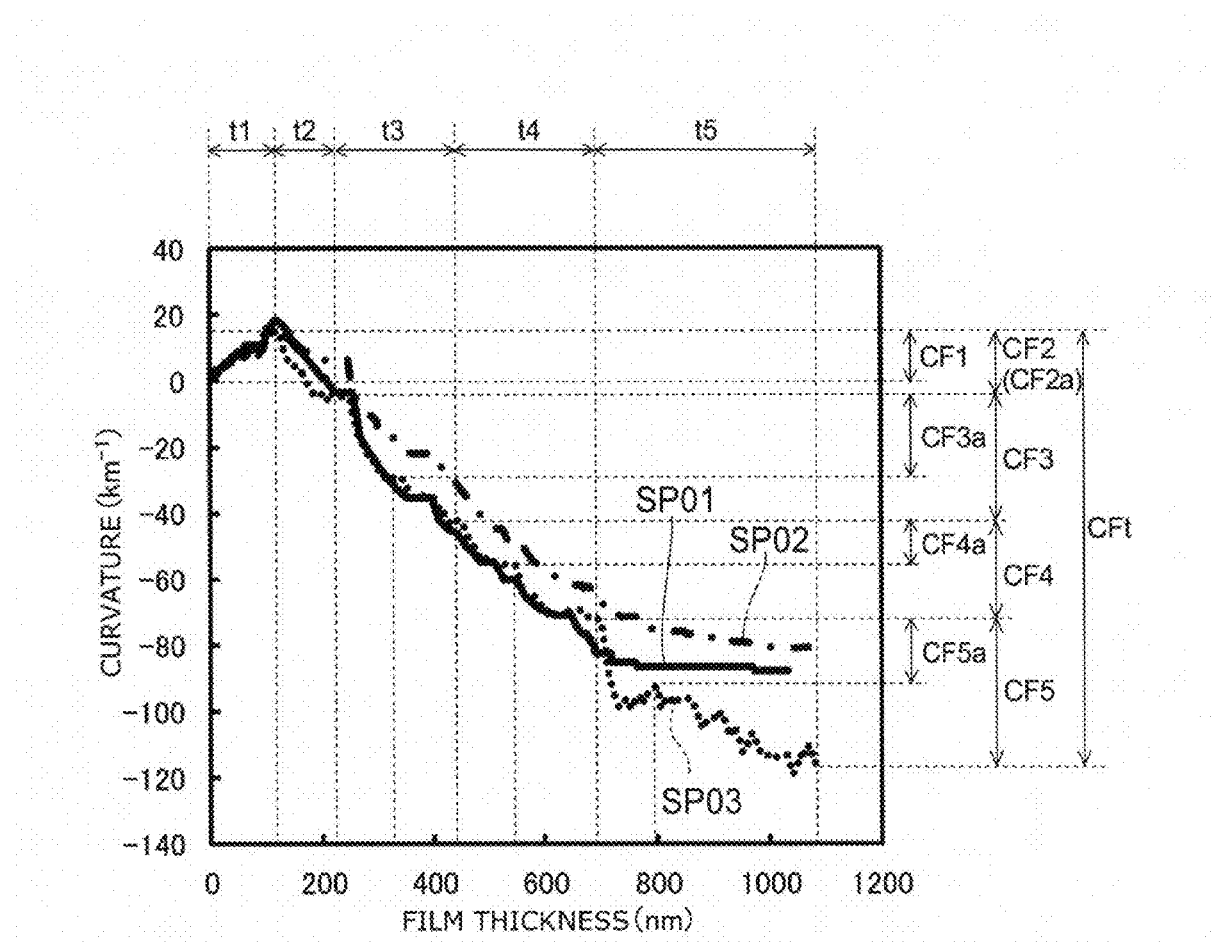
FIG. 6 is a graph showing the characteristics of the nitride semiconductor wafer according to the first embodiment.

FIG. 6 is a graph illustrating the characteristics of the nitride semiconductor wafer according to the first embodiment.

FIG. 6 shows the curvature change of the silicon substrate 40 in response to sequential film formation of the first buffer layer BF1 to the fifth buffer layer BF5 in the first sample SP01 to the third sample SP03.

In FIG. 6, the vertical axis represents the curvature CF ($km^{-1}$) of the nitride semiconductor wafer. The horizontal axis represents the thickness T (nm) of the first buffer unit 51. The thickness T being 0 nm corresponds to the interface between the silicon substrate 40 and the first buffer layer BF1.

The thickness of the silicon substrate 40 of the third sample SP03 is different from the first sample SP01 and SP02. For instance, on a plurality of silicon substrates 40 different in thickness, the same first buffer unit 51 is provided to form a plurality of samples. Then, the curvature of the silicon substrate 40 correlates with the thickness of the silicon substrate 40. This is because in the case of forming the same first buffer unit 51, even if the thickness of the silicon substrate 40 is changed, the stress applied to the first buffer unit 51 is substantially equal. The correlation between the curvature of the silicon substrate 40 and the thickness of the silicon substrate 40 is expressed by e.g. equation (2).

$$K = \frac{1}{R} = \frac{1}{M_s} \frac{6\sigma_f h_f}{h_s^2} \quad (2)$$

In equation (2), K is the curvature of the silicon substrate 40. R is the curvature radius of the silicon substrate 40. $M_s$ is the elastic coefficient of the silicon substrate 40. $\sigma_f$ is the thin film stress of the nitride semiconductor layer (e.g., the first buffer layer BF1 to the fifth buffer layer BF5). $h_f$ is the thin film thickness of the nitride semiconductor layer. $h_s$ is the thickness of the silicon substrate 40.

In FIG. 6, the change of the curvature of the third sample SP03 is calculated from a value converted to the curvature for the thickness (525 μm) of the silicon substrate 40 of the first sample SP01 and the second sample SP02 using equation (2).

In the case where the curvature CF is negative, the position in the Z-axis direction of the center of the silicon substrate 40 is higher than the position in the Z-axis direction of the edge of the silicon substrate 40. The curvature CF being negative corresponds to the state of the silicon substrate 40 warped in an upward convex shape. Conversely, the curvature CF being positive corresponds to the state of the silicon substrate 40 warped in a downward convex shape.

As shown in FIG. 6, in response to film formation of the first buffer layer BF1 to the fifth buffer layer BF5, the curvature of the silicon substrate 40 is changed. That is, the silicon substrate 40 is warped. For instance, the thickness t1 of the first buffer layer BF1 of the third sample SP03 is 120 nm (see FIG. 5). Hence, in FIG. 6, the variation of the curvature CF in the range of the thickness T from 0 nm to 120 nm is the curvature variation CF1 of the silicon substrate 40 associated with the film formation of the first buffer layer BF1. The variation of the curvature in the range of the thickness T from 0 nm to 120 nm is the difference between the curvature of the silicon substrate 40 before the film formation of the first buffer layer BF1 and the curvature of the silicon substrate 40 after the film formation of the first buffer layer BF1. For instance, in the third sample SP03, the curvature variation CF1 of the silicon substrate 40 associated with the film formation of the first buffer layer BF1 is approximately 14.4 $km^{-1}$ (converted value).

The thickness t2 of the second buffer layer BF2 of the third sample SP03 is 100 nm (see FIG. 5). The variation of the curvature CF in the range of the thickness T from 120 nm to 220 nm is the curvature variation CF2 of the silicon substrate 40 associated with the film formation of the second buffer layer BF2. In the third sample SP03, the curvature variation CF2 of the silicon substrate 40 associated with the film formation of the second buffer layer BF2 is approximately −18.1 $km^{-1}$ (converted value).

The thickness t3 of the third buffer layer BF3 of the third sample SP03 is 215 nm (see FIG. 5). The variation of the curvature CF in the range of the thickness T from 220 nm to 435 nm is the curvature variation CF3 of the silicon substrate 40 associated with the film formation of the third buffer layer BF3. In the third sample SP03, the curvature variation CF3 of the silicon substrate 40 associated with the film formation of the third buffer layer BF3 is approximately −38.6 $km^{-1}$ (converted value).

The thickness t4 of the fourth buffer layer BF4 of the third sample SP03 is 250 nm (see FIG. 5). The variation of the curvature CF in the range of the thickness T from 435 nm to 685 nm is the curvature variation CF4 of the silicon substrate 40 associated with the film formation of the fourth buffer layer BF4. In the third sample SP03, the curvature variation CF4 of the silicon substrate 40 associated with the film formation of the fourth buffer layer BF4 is approximately −29.8 km$^{-1}$ (converted value).

The thickness t5 of the fifth buffer layer BF5 of the third sample SP03 is 400 nm (see FIG. 5). The variation of the curvature CF in the range of the thickness T from 685 nm to 1085 nm is the curvature variation CF5 of the silicon substrate 40 associated with the film formation of the fifth buffer layer BF5. In the third sample SP03, the curvature variation CF5 of the silicon substrate 40 associated with the film formation of the fifth buffer layer BF5 is approximately −44.0 km$^{-1}$ (converted value).

Furthermore, in this characterization, variation of the curvature of the silicon substrate 40 due to film formation of the respective buffer layers are compared with each other. To this end, based on the above measurement result, the curvature variation of the silicon substrate 40 in response to film formation of the second buffer layer BF2 to the fifth buffer layer BF5 to a thickness of 100 nm is determined as follows.

As described above, the thickness t2 of the second buffer layer BF2 of the third sample SP03 is 100 nm. Thus, the curvature variation CF2a of the silicon substrate 40 associated with the film formation of the second buffer layer BF2 to a thickness of 100 nm is equal to the curvature variation CF2. In the third sample SP03, the curvature variation CF2a is approximately −18.1 km$^{-1}$ (converted value).

In the third sample SP03, the variation of the curvature CF in the range of the thickness T from 220 nm to 320 nm is the curvature variation CF3a of the silicon substrate 40 associated with the film formation of the third buffer layer BF3 to a thickness of 100 nm. In the third sample SP03, the curvature variation CF3a is approximately −15.8 km$^{-1}$ (converted value).

In the third sample SP03, the variation of the curvature CF in the range of the thickness T from 435 nm to 535 nm is the curvature variation CF4a of the silicon substrate 40 associated with the film formation of the fourth buffer layer BF4 to a thickness of 100 nm. In the third sample SP03, the curvature variation CF4a is approximately −13.3 km$^{-1}$ (converted value).

In the third sample SP03, the variation of the curvature CF in the range of the thickness T from 685 nm to 785 nm is the curvature variation CF5a of the silicon substrate 40 associated with the film formation of the fifth buffer layer BF5 to a thickness of 100 nm. In the third sample SP03, the curvature variation CF5a is approximately −22.6 km$^{-1}$ (converted value).

Here, the measurement apparatus used in the experiment has a limit to the measurement of the curvature CF. At that measurement limit, the maximum of the sum of the total curvature variation CFt on the negative side and the curvature variation CF1 on the positive side is approximately −85 km$^{-1}$. In the first sample SP01, in the range of the thickness T of 700 nm or more, the measurement apparatus reaches the measurement limit. Thus, the curvature variations CF5 and CF5a of the first sample SP01 is unable to be measured.

As shown in FIG. 6, in the case of forming the first buffer layer BF1 on the silicon substrate 40, the curvature of the silicon substrate 40 changes to the positive side. On the other hand, in the case of forming the second buffer layer BF2 on the first buffer layer BF1, in the case of forming the third buffer layer BF3 on the second buffer layer BF2, in the case of forming the fourth buffer layer BF4 on the third buffer layer BF3, and in the case of forming the fifth buffer layer BF5 on the fourth buffer layer BF4, the curvature of the silicon substrate 40 changes to the negative side.

In the case of forming an AlN layer on a silicon layer, a tensile stress is applied to the AlN layer due to the lattice constant difference in the first direction between silicon and AlN. In the case of forming an AlGaN layer on an AlN layer, a compressive stress is applied to the AlGaN layer due to the lattice length difference in the a-axis direction between AlN and AlGaN. Furthermore, in the case of forming, on a first AlGaN layer, a second AlGaN layer having a lower Al composition ratio than the first AlGaN layer, a compressive stress is applied to the second AlGaN layer due to the lattice length difference in the a-axis direction between the two AlGaN layers different in Al composition ratio. Furthermore, in the case of forming a GaN layer on an AlGaN layer, a compressive stress is applied to the GaN layer due to the lattice length difference in the a-axis direction between AlGaN and GaN. The difference in the direction of curvature change between the film formation of the first buffer layer BF1 and the film formation of the second buffer layer BF2 to the fifth buffer layer BF5 results from the difference of the applied stress.

In the case of negative curvature, the silicon substrate 40 is warped in an upward convex shape. That is, in the first sample SP01 to the third sample SP03, by the film formation of the second buffer layer to the fifth buffer layer BF5, the silicon substrate 40 is warped in an upward convex shape.

In the third sample SP03, the total curvature variation CFt of CF2, CF3, CF4, and CF5 is approximately −130.4 km$^{-1}$ (converted value). The total curvature variation CFt is the total curvature variation of the silicon substrate 40 due to compressive stress. On the other hand, in the third sample SP03, the total curvature variation CFa of CF2a, CF3a, CF4a, and CF5a is approximately −79.8 km$^{-1}$ (converted value). In FIG. 6, t1-t5, CF1-CF5, CF2a-CF5a, and CFt of the third sample SP03 are illustrates CFt.

FIG. 7 is a table illustrating the characteristics of the nitride semiconductor wafer according to the first embodiment.

FIG. 7 shows the measurement result of the characteristics of the first sample SP01 to the third sample SP03 and the curvature change of the silicon substrate 40.

FIG. 7 shows the measurement result of the lattice mismatch and the curvature variation. More specifically, FIG. 7 shows the lattice mismatch LM2(%) in the a-axis direction between the first buffer layer BF1 and the second buffer layer BF2, the lattice mismatch LM3(%) in the a-axis direction between the second buffer layer BF2 and the third buffer layer BF3, the lattice mismatch LM4(%) in the a-axis direction between the third buffer layer BF3 and the fourth buffer layer BF4, and the lattice mismatch LM5(%) in the a-axis direction between the fourth buffer layer BF4 and the fifth buffer layer BF5. FIG. 7 shows the lattice mismatch LMt (%) in the a-axis direction between the first buffer layer BF1 and the fifth buffer layer BF5. The lattice mismatches LM2-LM5 and LMt are the values obtained from the reciprocal lattice space mapping.

Furthermore, FIG. 7 shows:

The relaxation SR2 in the a-axis direction of the second buffer layer BF2, the relaxation SR3 in the a-axis direction of the third buffer layer BF3, the relaxation SR4 in the a-axis direction of the fourth buffer layer BF4, and the relaxation SR5 in the a-axis direction of the fifth buffer layer BF5, The curvature variation CF2a (km$^{-1}$), CF3a (km$^{-1}$), CF4a (km$^{-1}$), and CF5a (km$^{-1}$) of the silicon substrate 40 associated with the film formation of the second buffer layer BF2 to the fifth buffer layer BF5 to a thickness of 100 nm, respectively, The curvature variation CF2 (km$^{-1}$), CF3 (km$^{-1}$), CF4 (km$^{-1}$), and CF5 (km$^{-1}$) of the silicon substrate 40 associated with the film formation of the second buffer layer BF2 to the fifth buffer layer BF5, The total curvature variation CFa (km$^{-1}$) of CF2a, CF3a, CF4a, and CF5a, and The total curvature variation CFt (km$^{-1}$) of CF2, CF3, CF4, and CF5.

In the first sample SP01, the curvature variations CF5 and CF5a reach the measurement limit. Therefore, in FIG. 7, CF5, CF5a, CFa and CFt of the first sample SP01 are left blank. In the third sample SP03, the sum of the total curvature variation CFt on the negative side and the curvature variation CF1 on the positive side is −39.8 km$^{-1}$, which is in the measurement range. The thickness of the silicon substrate 40 of the third sample SP03 is 950 μm and is different from that of the first sample SP01 and the second sample SP02. Hence, for the total curvature variation CFt on the negative side in the third sample SP03 and the curvature variation CF1 on the positive side, values converted to the curvature for a substrate thickness of 525 μm using equation (2) are shown as the parenthesized value.

In the second sample SP02, the sum of the total curvature variation CFt on the negative side and the curvature variation CF1 on the positive side is −80.8 km$^{-1}$, which is in the measurement range.

The relaxation SRi in the a-axis direction of the (i+1)-th buffer layer BF(i+1) provided on the i-th buffer layer BFi is obtained e.g. by equation (3).

$$SRi = \frac{a2 - a1}{a2_R - a1} \quad (3)$$

In equation (3), a lattice length a1 in the a-axis direction of the i-th buffer layer BFi, a lattice length a2 in the a-axis direction of the (i+1)-th buffer layer BF(i+1), and a completely relaxed lattice length $a2_R$ in the a-axis direction of the (i+1)-th buffer layer BF(i+1) are shown. When the lattice length a2 in the a-axis direction of the (i+1)-th buffer layer BF(i+1) coincides with the lattice length a1 in the a-axis direction of the i-th buffer layer BFi (in the case of completely strained), the relaxation SRi in the a-axis direction of the (i+1)-th buffer layer BF(i+1) is zero. When the lattice length a2 in the a-axis direction of the (i+1)-th buffer layer BF(i+1) coincides with the completely relaxed lattice length $a2_R$ in the a-axis direction of the (i+1)-th buffer layer BF(i+1) (in the case of completely relaxed), the relaxation SRi in the a-axis direction of the (i+1)-th buffer layer BF(i+1) is 1. As a lattice mismatch between the lattice length a2 in the a-axis direction of the (i+1)-th buffer layer BF(i+1) and the lattice length a1 in the a-axis direction of the i-th buffer layer BFi is smaller, and the thickness of the (i+1)-th buffer layer BF(i+1) is thinner, the relaxation SRi in the a-axis direction of the (i+1)-th buffer layer BF(i+1) comes close to zero.

As shown in FIG. 6 and FIG. 7, the total curvature variation CFt is −97.2 km$^{-1}$ in the second sample SP02, and −130.4 km$^{-1}$ (converted value) in the third sample SP03. The curvature variation Cft of the third sample AP03 is larger than the curvature variation CFt of the second sample SP02. As shown in FIG. 6, the curvature variation CFt of the first sample SP01 is larger than the curvature variation CFt of the second sample SP02.

Hence, the compressive stress applied to the first buffer unit 51 of the first sample SP01 is larger than the compressive stress applied to the first buffer unit 51 of the second sample SP02. The compressive stress applied to the first buffer unit 51 of the third sample SP03 is larger than the compressive stress applied to the first buffer unit 51 of the second sample SP02. In the first sample SP01 and the third sample SP03, compared with the second sample SP02, a larger compressive stress can be applied to the first buffer unit 51, and cracks can be more suppressed.

The first sample SP01 to the third sample SP03 are further analyzed.

Figure 8:
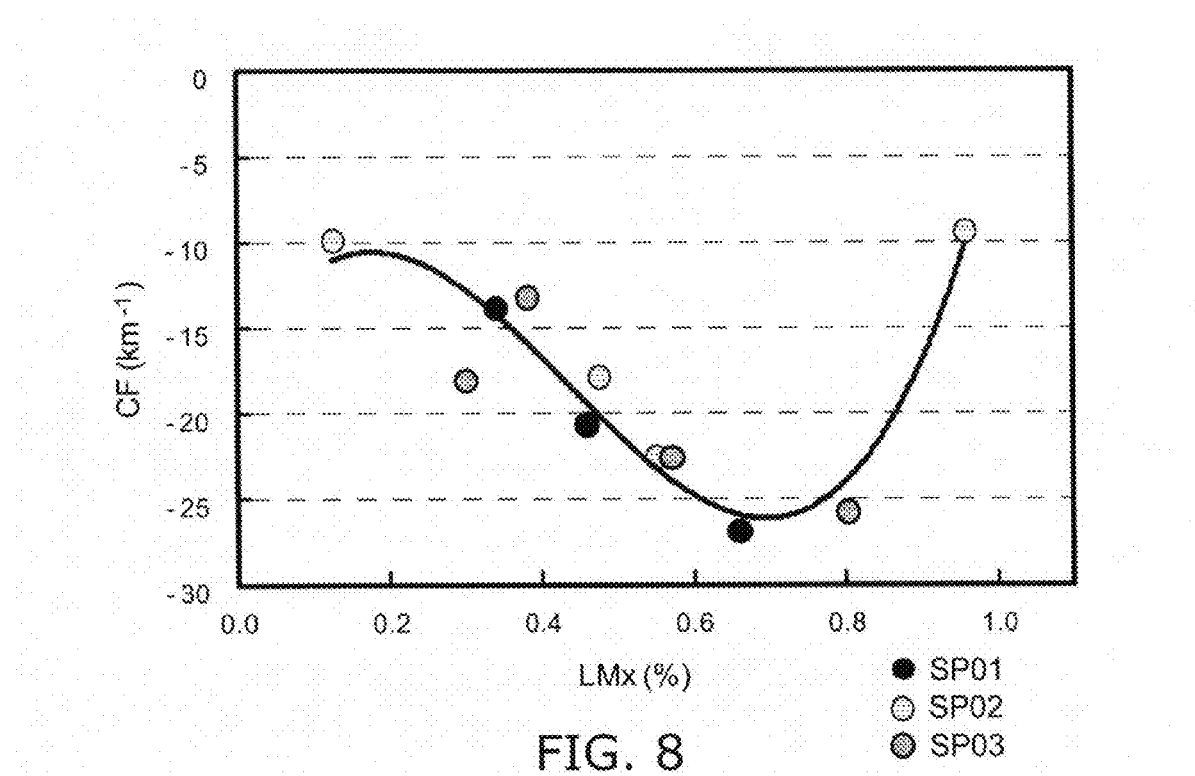
FIG. 8 is a graph showing the characteristics of the nitride semiconductor wafer according to the first embodiment.

FIG. 8 is a graph illustrating the characteristics of the nitride semiconductor wafer according to the first embodiment.

FIG. 8 is a graph plotting the curvature variations CF2a, CF3a, CF4a, and CF5a of the first sample SP01 to the third sample SP03. In FIG. 8, the vertical axis represents the curvature variation CF (km$^{-1}$) of the silicon substrate 40. The horizontal axis represents the lattice mismatch LMx (%) in the a-axis direction of the adjacent buffer layers in the Z-axis direction. FIG. 8 is an example of the relationship between the lattice mismatch LMx and the curvature variation CF in the case of forming a nitride semiconductor layer with a thickness of 100 nm.

As described above, CF5a of the first sample SP01 reaches the measurement limit of the measurement apparatus. Thus, CF5a of the first sample SP01 cannot be plotted in FIG. 8. Furthermore, for CF2a, CF3a, CF4a, and CF5a of the third sample SP03, the converted values determined by equation (2) are used.

As shown in FIG. 8, in the region of LMx≤0.8%, the absolute value of the curvature variation CF increases with the increase of the lattice mismatch LMx. On the other hand, in the region of 0.8%<LMx, the absolute value of the curvature variation CF decreases with the increase of the lattice mismatch LMx. It is considered that in the region of 0.8%<LMx, the absolute value of the curvature variation CF decreases with the increase of the lattice mismatch LMx because the lattice mismatch LMx becomes too large and causes lattice relaxation. By setting LMx≤0.8%, lattice relaxation can be suppressed. Furthermore, the occurrence of dislocations associated with lattice relaxation can be suppressed.

As shown in FIG. 8, the absolute value of the curvature variation CF of the nitride semiconductor wafer in the region of LMx<0.3% is smaller than the absolute value of the curvature variation CF of the nitride semiconductor wafer in the region of 0.3%≤LMx≤0.8%. The nitride semiconductor wafer is warped in an upward convex shape if a compressive stress is applied to the first buffer unit 51. The magnitude of the curvature of the nitride semiconductor wafer warped in an upward convex shape follows the magnitude of the compressive stress applied to the first buffer unit 51. Thus, the compressive stress applied to the first buffer unit 51 in the case of LMx≤0.3% is smaller than the compressive stress applied to the first buffer unit 51 in the case of 0.3%≤LMx≤0.8%.

By setting 0.3%≤LMx, the number of AlGaN layers between the AlN layer and the GaN layer can be suppressed. For instance, the number of AlGaN layers can be suppressed to 7 or less. Increase in the number of AlGaN layers complicates the setting of the growth condition such as the flow rate of TMA gas and the flow rate of TMG gas. This makes it difficult to manufacture the nitride semiconductor wafer. Hence, by setting 0.3%≤LMx, manufacturing of the nitride semiconductor wafer can be facilitated.

Furthermore, to obtain a curvature variation of the nitride semiconductor wafer equivalent to the range of 0.3%≤LMx≤0.8% in the range of LMx<0.3%, the AlGaN layer must be made thick. A thick AlGaN layer is likely to lose flatness. Loss of flatness of the AlGaN layer may incur the decrease of compressive stress of the nitride semiconductor layer grown on the AlGaN layer. Hence, by setting 0.3%≤LMx, the nitride semiconductor wafer can be thinned and the cracks can be suppressed.

In the embodiment, the first buffer layer BF1 to the fifth buffer layer BF5 are formed so as to satisfy the relation of 0.3%≤LMx≤0.8% for all of the lattice mismatches LMx in the a-axis direction between adjacent buffer layers in the Z-axis direction. Thus, a large compressive stress can be applied to the first buffer unit 51 compared with the case of not satisfying the relation of 0.3%≤LMx≤0.8%.

In the first sample SP01 of this experiment, the lattice mismatch LM2 to the lattice mismatch LM5 satisfy the relation of 0.3%≤LMx≤0.8% (see FIG. 7).

In contrast, in the second sample SP02, the lattice mismatch LM2 and the lattice mismatch LM5 do not satisfy the relation of 0.3%≤LMx≤0.8%.

In the third sample SP03, the lattice mismatch LM2 to the lattice mismatch LM5 satisfy the relation of 0.3%≤LMx≤0.8%.

As described above, the curvature variation of the first sample SP01 is larger than the curvature variation of the second sample SP02, and the compressive stress applied to the first buffer unit 51 of the first sample SP01 is larger than the compressive stress applied to the first buffer unit 51 of the second sample SP02. The curvature variation of the third sample SP03 is larger than the curvature variation of the second sample SP02, and the compressive stress applied to the first buffer unit 51 of the third sample SP03 is larger than the compressive stress applied to the first buffer unit 51 of the second sample SP02. Thus, the first buffer layer BF1 to the fifth buffer layer BF5 are formed so that all of the lattice mismatches LMx in the a-axis direction of the adjacent buffer layers in the Z-axis direction satisfy the relation of 0.3%≤LMx≤0.8%. Accordingly, a larger compressive stress can be applied to the first buffer unit 51 compared with the case of not satisfying the relation of 0.3%≤LMx≤0.8%.

As expressed in equation (2), the curvature of the silicon substrate 40 correlates with the thickness of the silicon substrate 40. Hence, even if the thickness of the silicon substrate 40 is changed, the first buffer layer BF1 to the fifth buffer layer BF5 can be formed so as to satisfy the relation of 0.3%≤LMx≤0.8% as in the case of setting the thickness of the silicon substrate 40 to 525 μm shown in FIG. 8. Thus, a large compressive stress can be applied to the first buffer unit 51 compared with the case of not satisfying the relation of 0.3%≤LMx≤0.8%.

In the nitride semiconductor wafer 110, the thermal expansion coefficient of the functional layer 10s, the second buffer unit 52, and the first buffer unit 51 including nitride semiconductor is different from the thermal expansion coefficient of the silicon substrate 40. Thus, when the nitride semiconductor wafer 110 is decreased from the growth temperature to room temperature, a tensile stress is applied to the functional layer 10s, the second buffer unit 52, and the first buffer unit 51. In conventional nitride semiconductor wafers, due to the tensile stress applied during temperature decrease, the nitride semiconductor wafer is warped in a downward convex shape. This may generate cracks in the functional layer 10s.

In the nitride semiconductor wafer 110, the tensile stress applied to the functional layer 10s during decreasing to room temperature can be balanced by the compressive stress of the first buffer unit 51. For instance, the warpage of the nitride semiconductor wafer 110 decreased to room temperature is suppressed. Thus, in the nitride semiconductor wafer 110, the occurrence of cracks in the functional layer 10s can be suppressed.

There is a semiconductor device in which a buffer layer including $Al_mGa_{1-m}N$ (0≤m≤1) is provided between the substrate and the functional layer. The Al composition ratio of the buffer layer is decreased from the substrate toward the functional layer. In the semiconductor device of this reference example, for instance, the Al composition ratio is decreased as 1.0, 0.8, 0.6, 0.4, 0.2, and 0. That is, the buffer layer of the semiconductor device of the reference example includes five buffer layers with the Al composition ratio equally distributed. The lattice mismatch LMc in the a-axis direction obtained from physical properties between AlN and GaN is 2.5%. The lattice mismatch LMt in the a-axis direction obtained from experiments between AlN and GaN is e.g. 1.9% or more and 2.5% or less. If this is equally distributed by the five buffer layers with the Al composition ratio equally distributed, the lattice mismatches LMx in the a-axis direction in the two adjacent buffer layers are 0.38% or more and 0.50% or less.

However, in the case where the lattice mismatch LMt in the a-axis direction of AlN and GaN is shared by the five buffer layers with the Al composition ratio equally distributed, the lattice mismatches LMx in the a-axis direction in the two adjacent buffer layers do not all fall within the range of 0.3%≤LM≤0.8%. For instance, forming $Al_{0.85}Ga_{0.15}N$ of 100 nm on AlN results in strained growth of $Al_{0.85}Ga_{0.15}N$. Thus, the lattice mismatch LMx between AlN and $Al_{0.85}Ga_{0.15}N$ is 0.0% and smaller than 0.3%.

The case where equally distributing the Al composition ratio is substantially equivalent to equally distributing the lattice mismatch LM is the case where e.g. $Al_mGa_{1-m}N$ is completely relaxed.

In the case of forming a buffer layer by e.g. epitaxial growth, the buffer layer is affected by the crystallinity and lattice length of the foundation layer. Thus, to obtain completely relaxed $Al_mGa_{1-m}N$ requires growing $Al_mGa_{1-m}N$ with a very large thickness of 1000 nm or more, although depending on the Al composition ratio.

However, the relaxation SRi in the a-axis direction of the completely relaxed $Al_mGa_{1-m}N$ is 1 and the compressive stress is not applied, and thus an effect of the suppression of cracks is not produced. Therefore, the relaxation SRi in the a-axis direction of the (i+1)-th buffer layer BF(i+1) provided on the i-th buffer layer BFi is needed to be smaller than 1. The relaxation SRi in the a-axis direction of the (i+1)-th buffer layer provided on the i-th buffer layer BFi is, e.g. favorably not more than 0.65.

Furthermore, in the case where the film thickness of $Al_mGa_{1-m}N$ is set to approximately 1 nm or more and 50 nm or less, $Al_mGa_{1-m}N$ is likely to undergo strained growth. Then, equally distributing the Al composition ratio does not correspond to equally distributing the lattice mismatch LMt in the a-axis direction between AlN and GaN.

In the nitride semiconductor wafer 110 according to the embodiment, for instance, the lattice mismatch LMt between AlN and GaN is distributed in AlGaN so that the lattice mismatches in the a-axis direction in the two adjacent buffer layers all satisfy the relation of 0.3%≤LMx≤0.8%. Thus, a large compressive stress can be applied to the first buffer unit 51 with compared with the case of not satisfying the relation of 0.3%≤LMx≤0.8%.

Figure 9:
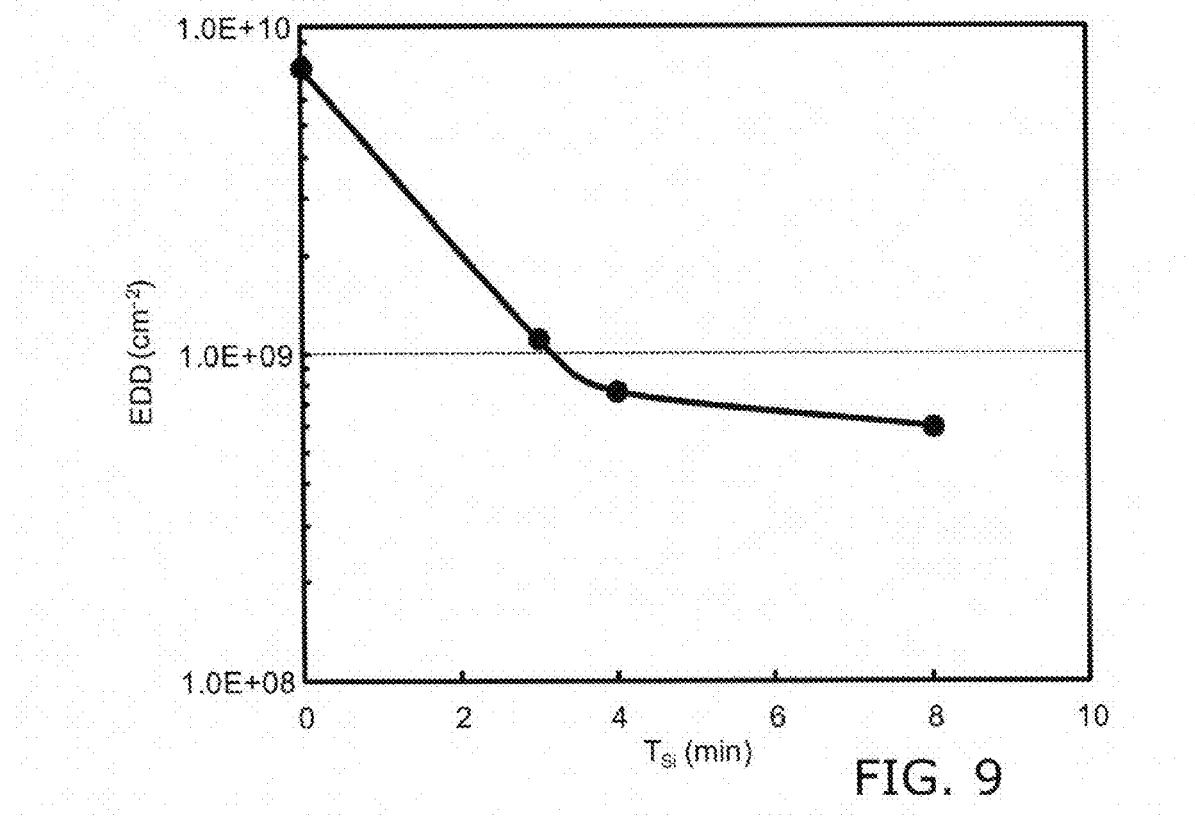
FIG. 9 is a graph showing the characteristics of the nitride semiconductor wafer according to the first embodiment.

FIG. 9 is a graph illustrating the characteristics of the nitride semiconductor wafer according to the first embodiment.

In FIG. 9, the vertical axis represents the edge dislocation density EDD ($cm^{-2}$). The horizontal axis represents the growth time $T_{Si}$ (minute) of the silicon-containing unit 55. FIG. 9 shows the result of an experiment measuring the edge dislocation density EDD of a plurality of samples. In fabricating the plurality of samples, the growth time $T_{Si}$ of the silicon-containing unit 55 is changed in the configuration of the nitride semiconductor wafer 110. In this experiment, $SiH_4$ is used as a silicon source gas. In this experiment, the growth temperature of the silicon-containing unit 52 is 1040° C., and the flow rate of $SiH_4$ is 350 lm. The growth temperature of the buffer unit 52 is 1090° C. The edge dislocation density EDD ($cm^{-2}$) can be obtained e.g. from a full wide at half maximum of rocking curve in X-ray diffraction method.

As shown in FIG. 9, for the sample with the growth time $T_{Si}$ being 0 minutes, the edge dislocation density EDD is $7.52 \times 10^9$ ($cm^{-2}$). The sample with the growth time $T_{Si}$ being 0 minutes is a sample in which the silicon-containing unit 55 is not provided. In the sample with the growth time $T_{si}$ being 3 minutes, the edge dislocation density EDD is $1.12 \times 10^9$ ($cm^{-2}$).

In the sample with the growth time $T_{si}$ being 4 minutes, the edge dislocation density EDD is $7.71 \times 10^8$ ($cm^{-2}$). In the sample with the growth time $T_{Si}$ being 8 minutes, the edge dislocation density EDD is $6.01 \times 10^8$ ($cm^{-2}$). Thus, by providing the silicon-containing unit 55, the edge dislocation density EDD can be reduced.

The thickness of the silicon-containing unit 55 is not less than 0.3 atomic layers and not more than 2.0 atomic layers, favorably not less than 0.5 atomic layers and not more than 1.4 atomic layers. If thinner than 0.3 atomic layers, reduction effect of the edge dislocation density EDD decreases, and if thicker than 2.0 atomic layers, crystal growth becomes difficult. The silicon concentration in the silicon-containing unit 55 is not less than $6.2 \times 10^{19}$ atoms/$cm^3$ and not more than $4.0 \times 10^{20}$ atoms/$cm^3$, favorably not less than $1.0 \times 10^{20}$ atoms/$cm^3$ and not more than $2.8 \times 10^{20}$ atoms/$cm^3$. Thereby, the dislocation density can be appropriately reduced.

Figure 10:
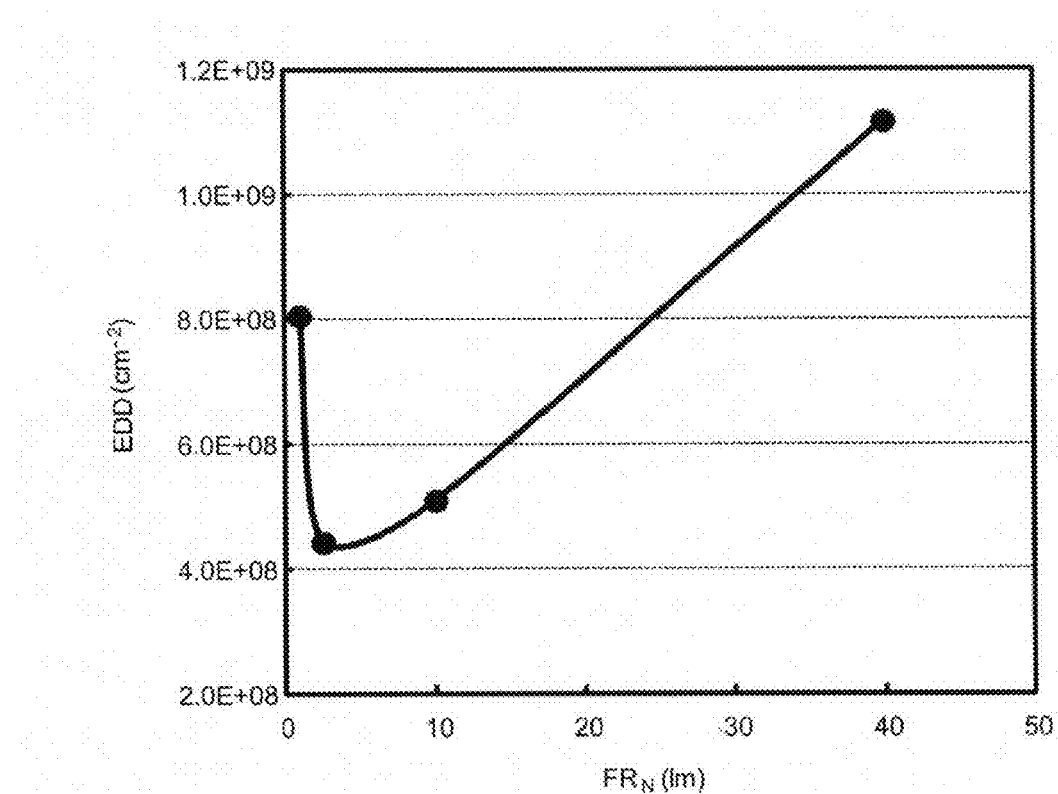
FIG. 10 is a graph showing the characteristics of the nitride semiconductor wafer according to the first embodiment.

FIG. 10 is a graph illustrating the characteristics of the nitride semiconductor wafer according to the first embodiment.

In FIG. 10, the vertical axis represents the edge dislocation density EDD ($cm^{-2}$). The horizontal axis represents the flow rate $FR_N$(lm) of $NH_3$ gas in 5 minutes from the growth start of the second buffer unit 52. FIG. 10 shows the result of an experiment measuring the edge dislocation density EDD of a plurality of samples. In fabricating the plurality of samples, the second buffer unit 52 is formed with the flow rate $FR_N$ of $NH_3$ gas changed in the configuration of the nitride semiconductor wafer 110. In this experiment, the growth time $T_{Si}$ of the silicon-containing unit 55 is 3 minutes, and the growth temperature is 1040° C. The silicon source gas is $SiH_4$, and the flow rate of $SiH_4$ is 350 lm. The growth temperature of the second buffer unit 55 is 1090° C., and the flow rate of TMGa is 56.4 ccm. In the growth of the second buffer unit 52, the flow rate of $NH_3$ gas after 5 minutes since the growth start is set to 40 lm.

As shown in FIG. 10, for the sample with the flow rate $FR_N$ being 1.0 lm, the edge dislocation density EDD is $8.05 \times 10^8$ $cm^{-2}$. For the sample with the flow rate $FR_N$ being 2.5 lm, the edge dislocation density EDD is $4.44 \times 10^8$ ($cm^{-2}$). For the sample with the flow rate $FR_N$ being 10 lm, the edge dislocation density EDD is $5.11 \times 10^8$ ($cm^{-2}$). For the sample with the flow rate $FR_N$ being 20 lm, the edge dislocation density EDD is $1.12 \times 10^9$ ($cm^{-2}$).

Thus, in forming the second buffer unit 52, the flow rate $FR_N$ of $NH_3$ gas in 5 minutes from the growth start is set to 2.5 lm or more and 10 lm or less. That is, the ratio of group V element (e.g., nitrogen) to group III element (e.g., gallium), i.e., the V/III ratio, is set to 490 or more and 1950 or less. Accordingly, the dislocation density can be reduced more appropriately.

There is a reference example including a silicon-containing unit 55 provided on the first buffer unit 51 in which in the first buffer layer BF1 to the n-th buffer layer BFn the lattice mismatch LMx in the a-axis direction of the two adjacent buffer layers does not satisfy the relation of 0.3%≤LMx≤0.8%. The reference example includes more specifically an AlN layer (first buffer layer BF1), an $Al_{0.7}Ga_{0.3}N$ layer provided on the AlN layer, an $Al_{0.5}Ga_{0.5}N$ layer provided on the $Al_{0.7}Ga_{0.3}N$ layer, an $Al_{0.25}Ga_{0.75}N$ layer (n-th buffer layer BFn) provided on the $Al_{0.5}Ga_{0.5}N$ layer, a SiN layer (silicon-containing unit 55) provided on the $Al_{0.25}Ga_{0.75}N$ layer, and a GaN layer (second buffer unit 52) provided on the SiN layer. In the structure of this reference example, a portion of the two adjacent buffer layers is produced, in which the lattice mismatch LMx in the a-axis direction does not satisfy the relation of 0.3%≤LMx≤0.8%. In the reference example, the SiN layer is formed by setting the silicon source gas to $SiH_4$, setting the flow rate of $SiH_4$ to 350 ml, and setting the growth time $T_{Si}$ to 6 minutes. In the reference example, the GaN layer is formed by setting the flow rate of NH3 gas to 20 ml and setting the V/III ratio to 3900. In this reference example, the edge dislocation density EDD is $5.78 \times 10^9$ ($cm^{-2}$). Thus, even if a silicon-containing unit 55 is provided on the first buffer unit 51 not satisfying the relation of 0.3%≤LMx≤0.8%, the effect of reducing the dislocation density is small. Thus, in the case of not appropriate buffer layer, it is difficult to reduce the dislocation density even if a silicon-containing unit 55 is provided.

In experiments on the suppression of cracks, the inventors have evaluated the dislocation density and found the configuration in which the dislocation density can be suppressed while suppressing the cracks. That is, they have found that cracks can be suppressed by providing the first buffer layer BF1 to the n-th buffer layer BFn in which the lattice mismatches in the a-axis direction of the two adjacent buffer layers all satisfy the relation of 0.3%≤LMx≤0.8%. Furthermore, in the process of the experiments, the inventors have discovered that the dislocation density can be reduced by providing a silicon-containing unit 55 between the first buffer unit 51 and the second buffer unit 52. The silicon-containing unit 55 formed on the first buffer unit 51 affects the film quality of the nitride semiconductor layer (upper layer unit 15) formed on the silicon-containing unit 55 (see FIG. 4A to FIG. 4D). It is considered that the reduction of dislocation density is attributed to the improvement of the film quality of the upper layer unit 15 (in this example, the second buffer unit 52) by providing the silicon-containing unit 55.

Thus, in the nitride semiconductor wafer 110 according to the embodiment, cracks can be suppressed, and the dislocation density can be reduced. This is the effect derived for the first time by the experiments of the inventor.

In the embodiment, the thickness t1 is e.g. 120 nm (80 nm or more and 180 nm or less). The thickness t2 is e.g. 100 nm (50 nm or more and 150 nm or less). The thickness t3 is e.g. 200 nm (150 nm or more and 250 nm or less). The thickness t4 is e.g. 250 nm (200 nm or more and 300 nm or less). The thickness t5 is e.g. 330 nm (300 nm or more and 350 nm or less).

Alternatively, the thickness t1 is e.g. 240 nm (200 nm or more and 300 nm or less). The thickness t2 is e.g. 150 nm (100 nm or more and 200 nm or less). The thickness t3 is e.g. 300 nm (250 nm or more and 350 nm or less). The thickness t4 is e.g. 400 nm (350 nm or more and 450 nm or less). The thickness t5 is e.g. 500 nm (450 nm or more and 550 nm or less).

Alternatively, the thickness t1 is e.g. 360 nm (300 nm or more and 400 nm or less). The thickness t2 is e.g. 200 nm (150 nm or more and 250 nm or less). The thickness t3 is e.g. 400 nm (350 nm or more and 450 nm or less). The thickness t4 is e.g. 500 nm (450 nm or more and 550 nm or less). The thickness t5 is e.g. 600 nm (550 nm or more and 650 nm or less).

Thus, the thickness t2, thickness t3, thickness t4, and thickness t5 may be changed corresponding to the thickness t1. The thickness t1 to the thickness t5 are not limited to the above. For instance, the thickness t2, the thickness t3, the thickness t4 and the thickness t5, e.g. can be set arbitrarily in a range where the curvature CF of the nitride semiconductor wafer 110 varies with the growth of the buffer layers.

Figure 11:
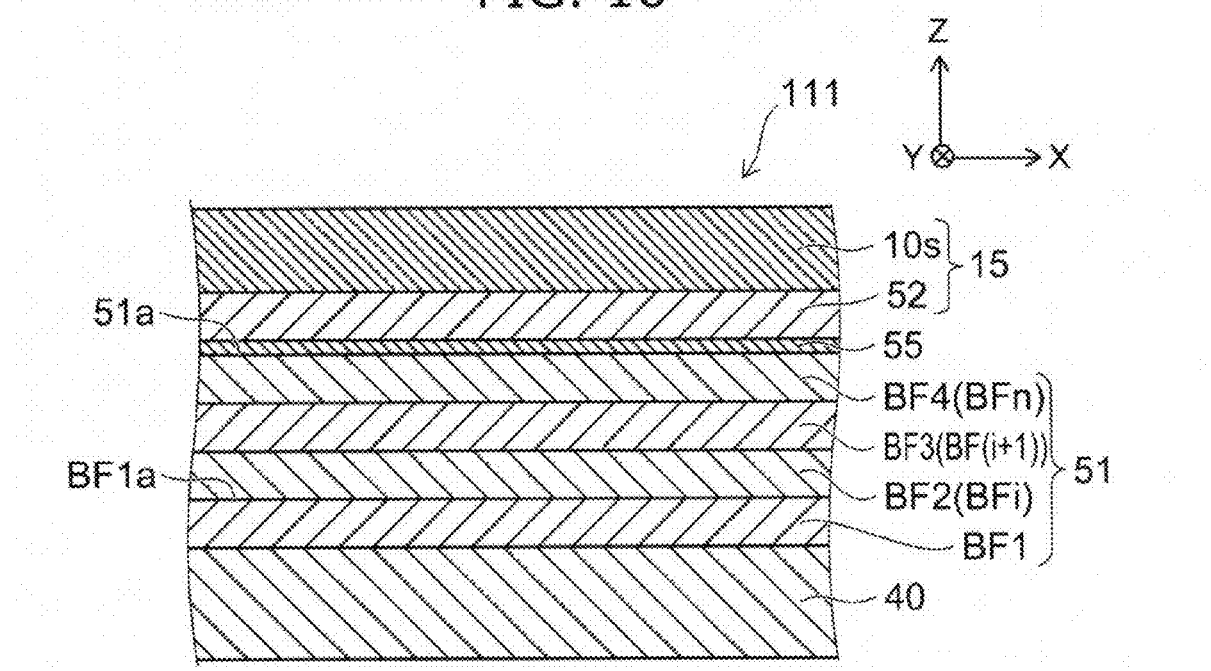
FIG. 11 is a schematic sectional view showing an alternative nitride semiconductor wafer according to the first embodiment.

FIG. 11 is a schematic sectional view illustrating an alternative nitride semiconductor wafer according to the first embodiment.

As shown in FIG. 11, in the nitride semiconductor wafer 111, the first buffer unit 51 includes four nitride semiconductor layers, i.e., the first buffer layer BF1 to the fourth buffer layer BF4.

In this example, the fourth buffer layer BF4 includes $Al_{x4}Ga_{1-x4}N$ ($0 \le x4 < x3$). In this example, the fourth buffer layer BF4 includes e.g. AlGaN. The Al composition ratio x4 of the fourth buffer layer BF4 is e.g. 0.15.

In the case of x0=0 and x4=0.15, the lattice mismatch LMx in the a-axis direction between the fourth buffer layer BF4 (n-th buffer layer BFn) and the second buffer unit 52 also satisfies the relation of $0.3\% \le LMx \le 0.8\%$. Thus, the lattice mismatch LMx in the a-axis direction between the n-th buffer layer BFn and the second buffer unit 52 may satisfy the relation of $0.3\% \le LMx \le 0.8\%$.

Also in this nitride semiconductor wafer 111, by providing the first buffer unit 51 in which the lattice mismatch LMx in the a-axis direction in the two adjacent buffer layers satisfy the relation of $0.3\% \le LMx \le 0.8\%$ and the silicon-containing unit 55, cracks can be suppressed, and the dislocation density can be reduced.

Figure 12:
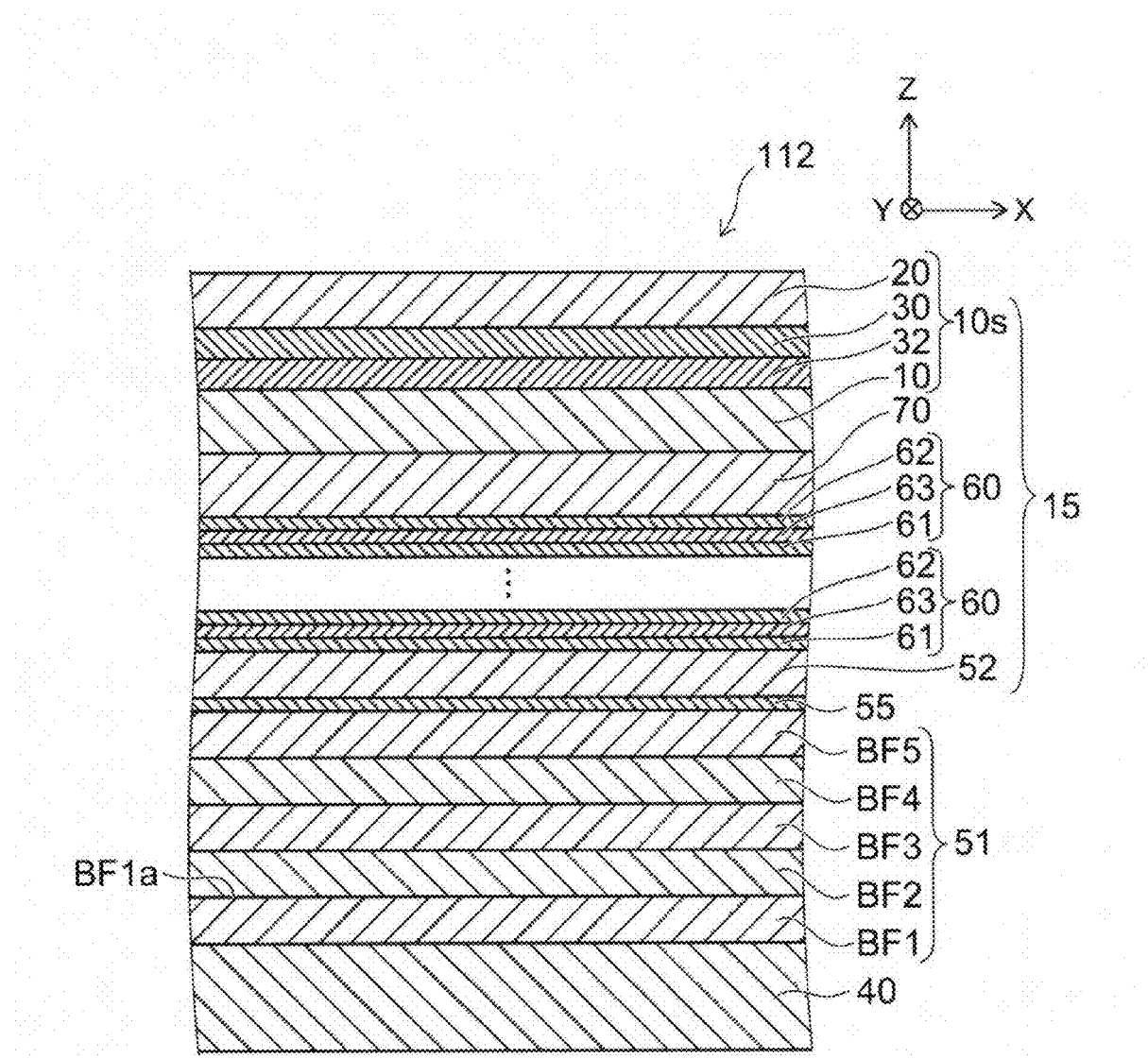
FIG. 12 is a schematic sectional view showing an alternative nitride semiconductor wafer according to the first embodiment.

FIG. 12 is a schematic sectional view illustrating an alternative nitride semiconductor wafer according to the first embodiment.

As shown in FIG. 12, in the nitride semiconductor wafer 112, the functional layer 10s includes a first semiconductor layer 10, a second semiconductor layer 20, a light emitting layer 30, and a stacked unit 32. That is, the nitride semiconductor wafer 112 is a wafer for manufacturing a semiconductor light emitting device as a nitride semiconductor device.

The first semiconductor layer 10 includes nitride semiconductor. The first semiconductor layer 10 includes e.g. GaN of a first conductivity type. The first conductivity type is n-type, and the second conductivity type is p-type. Alternatively, the first conductivity type may be p-type, and the second conductivity type may be n-type. In the following description, it is assumed that the first conductivity type is n-type, and the second conductivity type is p-type. For instance, the first semiconductor layer 10 is an n-type GaN layer. In this example, the first semiconductor layer 10 is an impurity-containing layer IL. Alternatively, the impurity-containing layer IL may be the second semiconductor layer 20.

The first semiconductor layer 10 is provided on the second buffer unit 52. The stacked unit 32 is provided on the first semiconductor layer 10. The light emitting layer 30 is provided on the stacked unit 32. That is, the light emitting layer 30 is provided on the first semiconductor layer 10, and the stacked unit 32 is provided between the first semiconductor layer 10 and the light emitting layer 30. The second semiconductor layer 20 is provided on the light emitting layer 30. The second semiconductor layer 20 includes nitride semiconductor, and is of the second conductivity type. The second semiconductor layer 20 is e.g. a p-type GaN layer. By passing a current in the light emitting layer 30 through the first semiconductor layer 10 and the second semiconductor layer 20, light is emitted from the light emitting layer 30. The stacked unit 32 is provided as appropriate in the functional layer 10s, and can be omitted.

Figure 13:
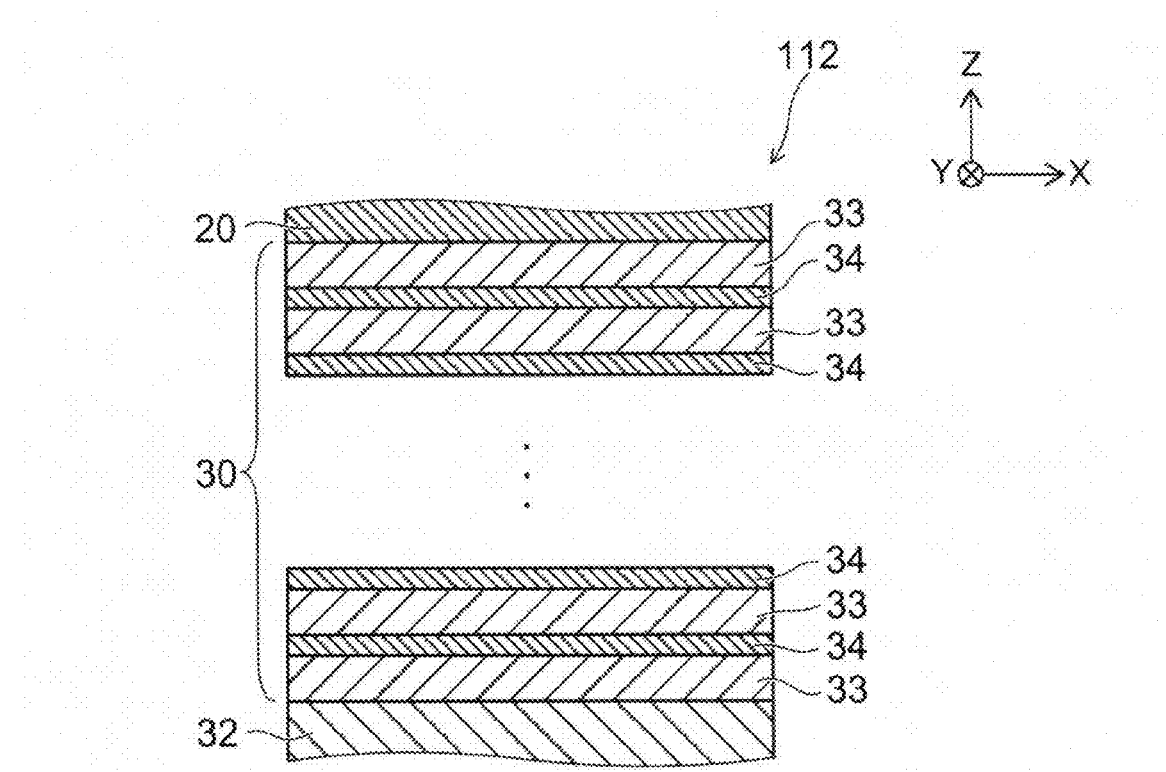
FIG. 13 is a schematic sectional view showing part of the alternative nitride semiconductor wafer according to the first embodiment.

FIG. 13 is a schematic sectional view illustrating part of the alternative nitride semiconductor wafer according to the first embodiment.

As shown in FIG. 13, the light emitting layer 30 includes a plurality of barrier layers 33 and a well layer 34 provided between the plurality of barrier layers 33. For instance, a plurality of barrier layers 33 and a plurality of well layers 34 are alternately stacked along the Z-axis direction.

The number of well layers 34 may be either 1, or 2 or more. That is, the light emitting layer 30 can have an SQW (single-quantum well) structure or an MQW (multi-quantum well) structure.

The bandgap energy of the barrier layer 33 is larger than the bandgap energy of the well layer 34. The well layer 34 is made of e.g. $In_\alpha Ga_{1-\alpha}N$ ($0 < \alpha < 1$). The barrier layer 33 is made of e.g. GaN.

The barrier layer 33 includes a nitride semiconductor including a group III element and a group V element. The well layer 34 includes a nitride semiconductor including a group III element and a group V element. The well layer 34 includes a nitride semiconductor including e.g. indium (In) and gallium (Ga).

Figure 14:
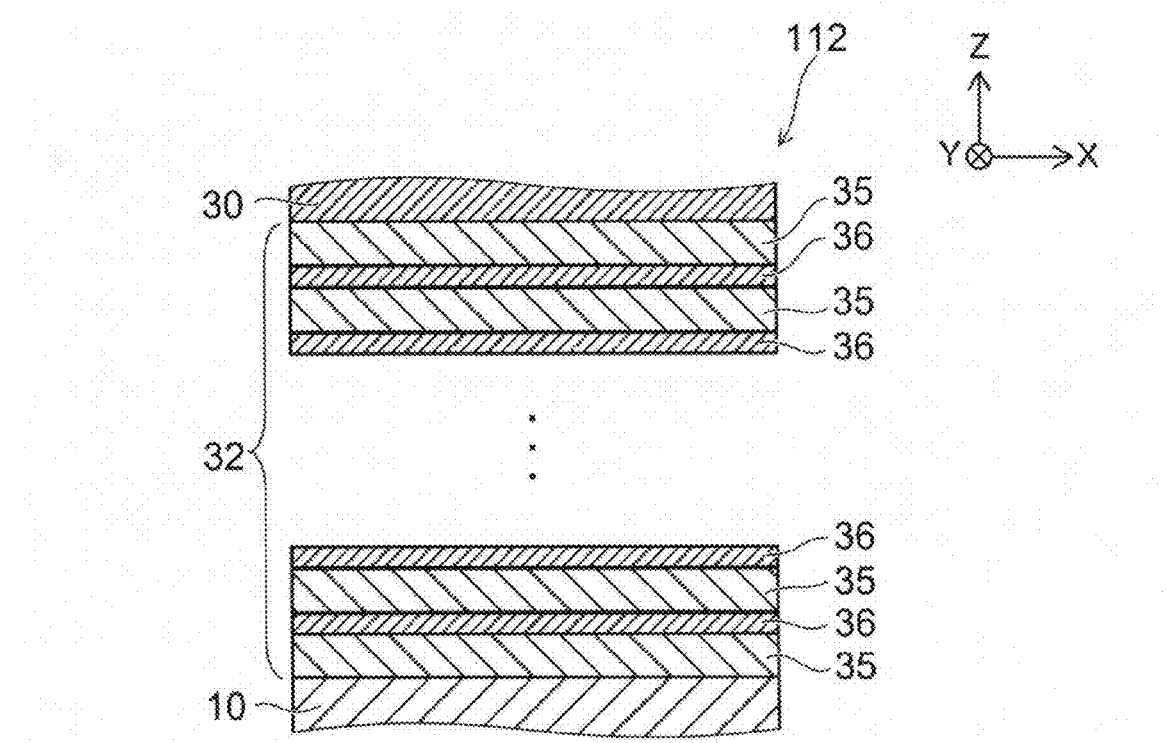
FIG. 14 is a schematic sectional view showing part of the alternative nitride semiconductor wafer according to the first embodiment.

FIG. 14 is a schematic sectional view illustrating part of the alternative nitride semiconductor wafer according to the first embodiment.

As shown in FIG. 14, the stacked unit 32 includes a plurality of high bandgap energy layers 35 and a plurality of low bandgap energy layers 36 stacked alternately. The plurality of high bandgap energy layers 35 include nitride semiconductor. The plurality of low bandgap energy layers 36 include nitride semiconductor. Each bandgap energy of the plurality of low bandgap energy layers 36 is lower than each bandgap energy of the plurality of high bandgap energy layers 35. Each bandgap energy of the plurality of low bandgap energy layers 36 is higher than each bandgap energy of the plurality of well layers 34.

The stacked unit 32 is e.g. a superlattice layer.

The high bandgap energy layer 35 includes a nitride semiconductor including a group III element and a group V element. The low bandgap energy layer 36 includes a nitride semiconductor including a group III element and a group V element. The low bandgap energy layer 36 includes a nitride semiconductor including e.g. In and Ga.

In this example, the upper layer unit 15 of the nitride semiconductor wafer 112 further includes an intermediate layer 60.

The intermediate layer 60 is provided between the second buffer unit 52 and the functional layer 10s. The intermediate layer 60 includes a first layer 61, a second layer 62, and a third layer 63. The second layer 62 is provided on the first layer 61. The third layer 63 is provided on the first layer 61 and between the first layer 61 and the second layer 62. For instance, the set of the first layer 61, the third layer 63, and the second layer 62 stacked in this order is stacked in a plurality along the Z-axis direction.

The first layer 61 includes a nitride semiconductor including Al. The second layer 62 includes a nitride semiconductor having a lower Al composition ratio than the first layer 61. The third layer 63 includes a nitride semiconductor including Al. The Al composition ratio of the third layer 63 is lower than the Al composition ratio of the first layer 61, and higher than the Al composition ratio of the second layer 62. The first layer 61 is e.g. an AlN layer. The second layer 62 is e.g. a GaN layer. Namely, the second layer 62 may be not including Al. The third layer 63 is e.g. an AlGaN layer.

The thickness of the first layer 61 is e.g. 12 nm (e.g., 10 nm or more and 14 nm or less). The thickness of the second layer 62 is e.g. 450 nm (e.g., 300 nm or more and 600 nm or less). The thickness of the third layer 63 is e.g. 20 nm (e.g., 15 nm or more and 25 nm or less).

By providing an intermediate layer 60, for instance, propagation of defects such as threading dislocations due to lattice mismatch between the silicon substrate 40 and the functional layer 10s is suppressed. Thus, for instance, the performance of the nitride semiconductor device can be improved. In the intermediate layer 60, the third layer 63 is provided as needed, and can be omitted.

In this example, the nitride semiconductor wafer 112 further includes a foundation layer 70.

The foundation layer 70 is provided between the second buffer unit 52 and the functional layer 10s. In this example, the foundation layer 70 is provided between the intermediate layer 60 and the functional layer 10s. The foundation layer 70 includes nitride semiconductor. The concentration of impurity included in the foundation layer 70 is lower than the concentration of impurity included in the functional layer 10s. The concentration of impurity included in the foundation layer 70 is lower than the concentration of impurity included in the first semiconductor layer 10. The foundation layer 70 is e.g. a non-doped GaN layer (i-GaN layer). The thickness of the foundation layer 70 is e.g. 1000 nm or more.

Figure 15:
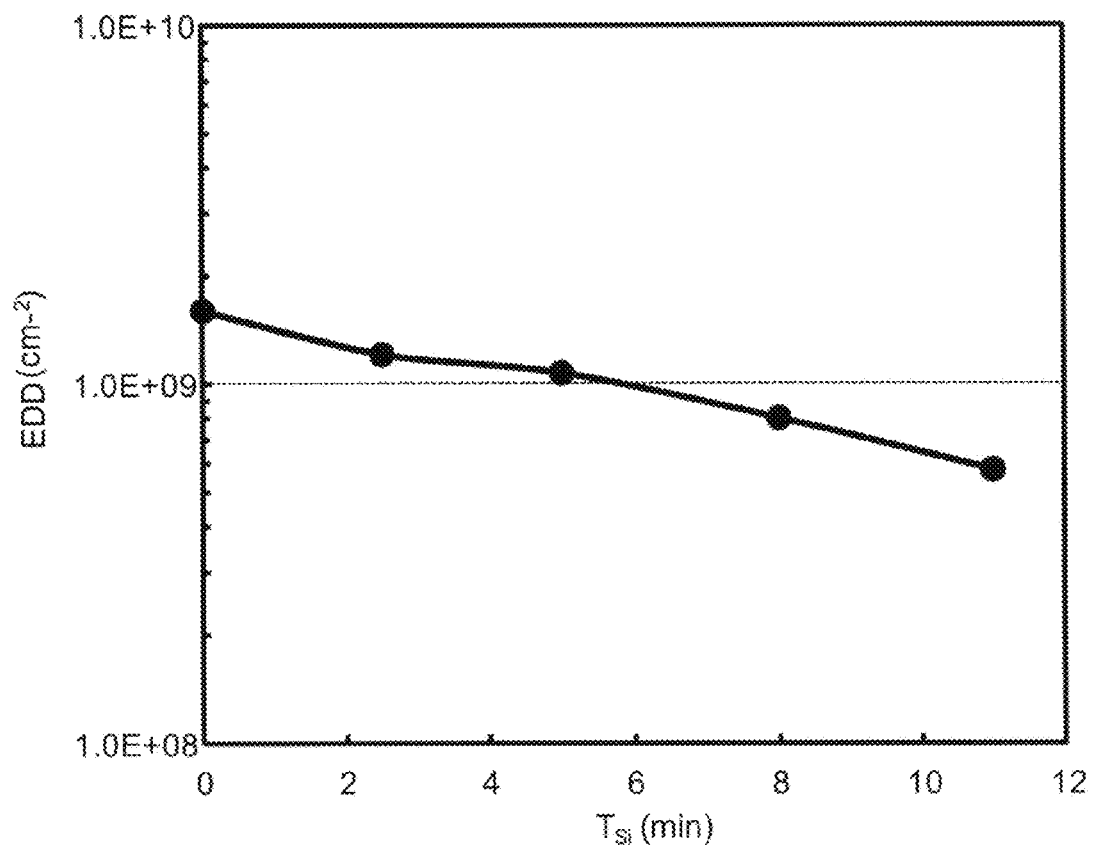
FIG. 15 is a graph showing the characteristics of the alternative nitride semiconductor wafer according to the first embodiment.

FIG. 15 is a graph illustrating the characteristics of the alternative nitride semiconductor wafer according to the first embodiment.

In FIG. 15, the vertical axis represents the edge dislocation density ($cm^{-2}$). The horizontal axis represents the growth time $T_{Si}$ (minute) of the silicon-containing unit 55. FIG. 15 shows the result of an experiment measuring the edge dislocation density of a plurality of samples. In fabricating the plurality of samples, the growth time $T_{Si}$ of the silicon-containing unit 55 is changed in the configuration of the nitride semiconductor wafer 112. In this experiment, the growth temperature of the silicon-containing unit 55 is 1040° C. In this experiment, $SiH_4$ is used as a silicon source gas, the flow rate of $SiH_4$ is 350 lm.

As shown in FIG. 15, for the sample with the growth time $T_{Si}$ being 0 minutes, the edge dislocation density is $1.6 \times 10^9$ $cm^{-2}$. In the sample with the growth time $T_{Si}$ being 11 minutes, the edge dislocation density is $5.77 \times 10^8$ $cm^{-2}$.

Thus, also in the nitride semiconductor wafer 112, cracks can be suppressed, and the dislocation density can be reduced.

Figure 16:
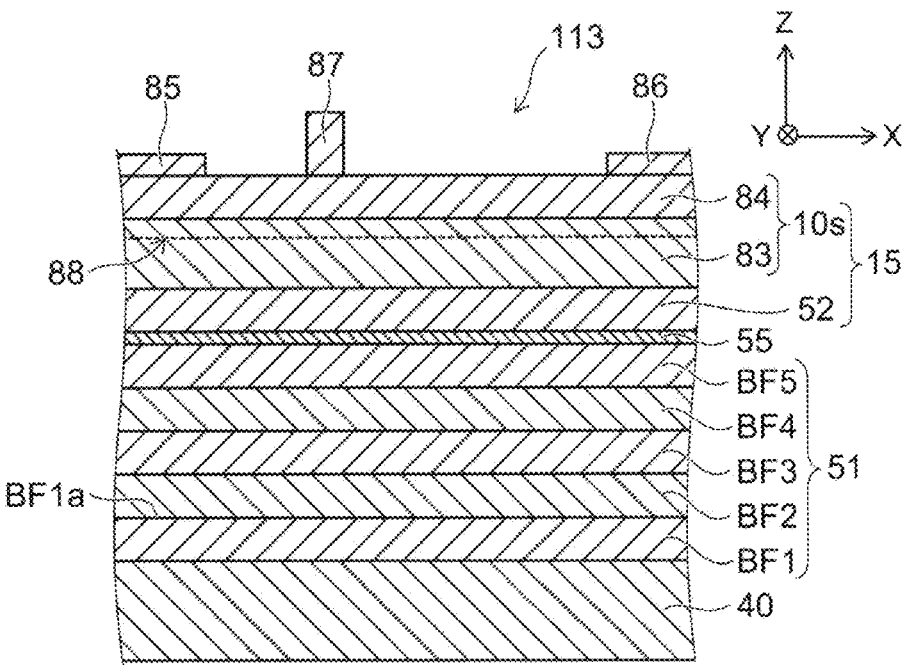
FIG. 16 is a schematic sectional view showing an alternative nitride semiconductor wafer according to the first embodiment.

FIG. 16 is a schematic sectional view illustrating an alternative nitride semiconductor wafer according to the first embodiment.

As shown in FIG. 16, in the nitride semiconductor wafer 113, the functional layer 10s includes a third semiconductor layer 83 provided on the second buffer unit 52, and a fourth semiconductor layer 84 provided on the third semiconductor layer 83 and having a larger bandgap than the third semiconductor layer 83. This nitride semiconductor wafer 113 is a wafer for manufacturing e.g. a GaN-based HEMT as a nitride semiconductor device.

The third semiconductor layer 83 is a channel layer. The fourth semiconductor layer 84 is a barrier layer. The third semiconductor layer 83 and the fourth semiconductor layer 84 form a heterojunction. The third semiconductor layer 83 is made of e.g. AlGaN or GaN. The fourth semiconductor layer 84 is made of e.g. AlGaN or GaN. The third semiconductor layer 83 is e.g. non-doped. For instance, the third semiconductor layer 83 includes no impurity. The fourth semiconductor layer 84 is e.g. non-doped or of n-type. For instance, the fourth semiconductor layer 84 includes no impurity, or includes n-type impurity. The third semiconductor layer 83 is e.g. a non-doped GaN layer. The fourth semiconductor layer 84 is e.g. a non-doped or n-type AlGaN layer.

On the fourth semiconductor layer 84, a source electrode 85 and a drain electrode 86 are provided and spaced from each other. The source electrode 85 and the drain electrode 86 are each in ohmic contact with the surface of the fourth semiconductor layer 84. A gate electrode 87 is provided on the fourth semiconductor layer 84 between the source electrode 85 and the drain electrode 86. The gate electrode 87 is in Schottky contact with the surface of the fourth semiconductor layer 84.

The lattice constant of the fourth semiconductor layer 84 is smaller than the lattice constant of the third semiconductor layer 83. This generates strain in the fourth semiconductor layer 84. By the piezoelectric effect, piezoelectric polarization occurs in the fourth semiconductor layer 84. Thus, a two-dimensional electron gas 88 is formed near the interface with the fourth semiconductor layer 84 in the third semiconductor layer 83. By controlling the voltage applied to the gate electrode 87, the concentration of the two-dimensional electron gas 88 below the gate electrode 87 is increased or decreased. This controls the current flowing between the source electrode 85 and the drain electrode 86.

Also in this nitride semiconductor wafer 113, cracks can be suppressed, and the dislocation density can be reduced.

Second Embodiment

Figure 17:
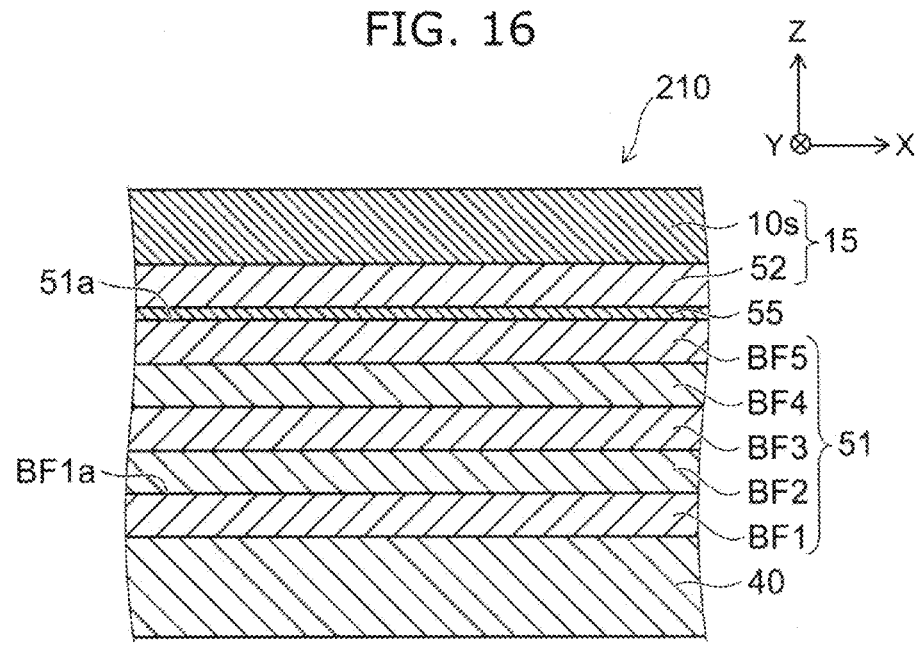
FIG. 17 is a schematic sectional view showing a nitride semiconductor device according to a second embodiment.

FIG. 17 is a schematic sectional view illustrating a nitride semiconductor device according to a second embodiment.

As shown in FIG. 17, the nitride semiconductor device 210 according to the embodiment includes a first buffer unit 51, a silicon-containing unit 55, and an upper layer unit 15. The upper layer unit 15 includes a second buffer unit 52 and a functional layer 10s.

The nitride semiconductor device 210 is manufactured from the nitride semiconductor wafer 110. The first buffer unit is formed on a silicon substrate 40. In the nitride semiconductor device 210, the silicon substrate 40 can be omitted. The first buffer unit 51, the silicon-containing unit 55, the second buffer unit 52, and the functional layer 10s can be based on the configuration described with reference to the first embodiment.

Thus, the nitride semiconductor device 210 with suppressed cracks and reduced dislocation density is provided.

Third Embodiment

The embodiment relates to a method for manufacturing a nitride semiconductor wafer. The embodiment corresponds to part of a method for manufacturing a nitride semiconductor device.

FIG. 18A to FIG. 18E are sequential schematic sectional views illustrating the method for manufacturing a nitride semiconductor wafer according to the third embodiment.

Figure 18A:
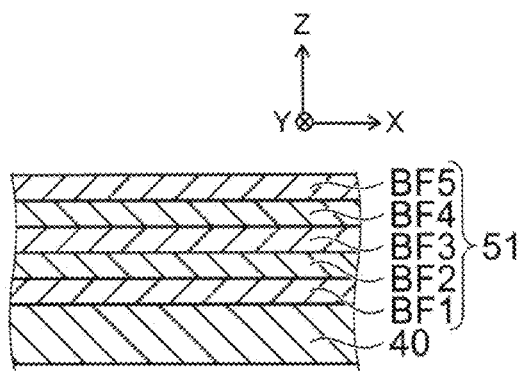
FIGS. 18A to 18E are sequential schematic sectional views showing the method for manufacturing a nitride semiconductor wafer according to the third embodiment.

As shown in FIG. 18A, on a major surface 40a of a silicon substrate 40, a first buffer layer BF1 is formed. For instance, an AlN layer having a thickness of 120 nm is formed as the first buffer layer BF1. On the first buffer layer BF1, a second buffer layer BF2 is formed. For instance, an AlGaN layer having a thickness of 100 nm and an Al composition ratio of 50% is formed as the second buffer layer BF2. On the second buffer layer BF2, a third buffer layer BF3 is formed. For instance, an AlGaN layer having a thickness of 200 nm and an Al composition ratio of 30% is formed as the third buffer layer BF3. On the third buffer layer BF3, a fourth buffer layer BF4 is formed. For instance, an AlGaN layer having a thickness of 250 nm and an Al composition ratio of 15% is formed as the fourth buffer layer BF4. On the fourth buffer layer BF4, a fifth buffer layer BF5 is formed. For instance, a GaN layer having a thickness of 360 nm is formed as the fifth buffer layer BF5. Thus, a first buffer unit 51 is formed on the silicon substrate 40.

In the first buffer unit 51, the Al composition ratio of the AlGaN layer of the second buffer layer BF2 to the fourth buffer layer BF4 is adjusted so that the lattice mismatches LMx in the a-axis direction in the two adjacent buffer layers all satisfy the relation of $0.3\% \leq LMx \leq 0.8\%$ in the first buffer layer BF1 to the fifth buffer layer BF5. Thus, a larger compressive stress than the case of not satisfying the relation of $0.3\% \leq LMx \leq 0.8\%$ is applied to the first buffer unit 51. This suppresses the occurrence of cracks in the functional layer 10s formed later.

Figure 18B:
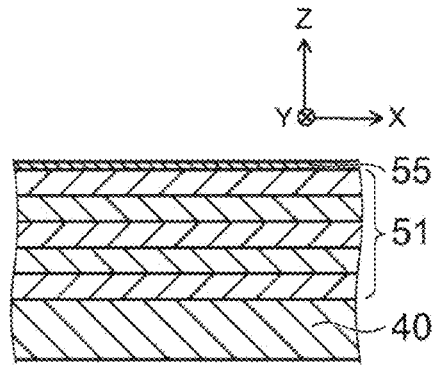

As shown in FIG. 18B, on the first buffer unit 51 (fifth buffer layer BF5), a silicon-containing unit 55 is formed. The silicon-containing unit 55 is formed by supplying $SiH_4$ at a flow rate of 350 lm for 8 minutes at 1040° C. onto the silicon substrate 40 with the first buffer unit 51 formed thereon.

Figure 18C:
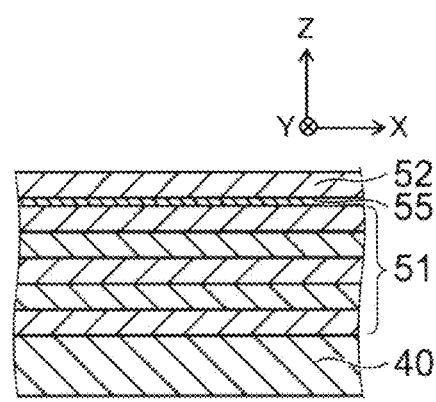

As shown in FIG. 18C, on the silicon-containing unit 55, a second buffer unit 52 is formed at 1090° C. For instance, a GaN layer having a thickness of 2000 nm is formed as the second buffer unit 52.

The first buffer unit 51 may be e.g. a stacked unit including the first buffer layer BF1 to the fourth buffer layer BF4. That is, the first buffer unit 51 may be not including the GaN layer. The silicon-containing unit 55 may be formed on the fourth buffer layer BF4, and the second buffer unit 52 may be formed on the silicon-containing unit 55.

Figure 18D:
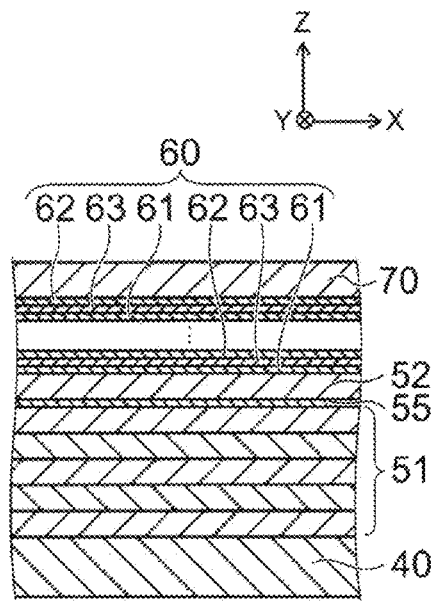

As shown in FIG. 18D, on the second buffer unit 52, a first layer 61 is formed. For instance, an AlN layer having a thickness of 12 nm is formed as the first layer 61. On the first layer 61, a third layer 63 is formed. For instance, an AlGaN layer having a thickness of 24 nm is formed as the third layer 63. On the third layer 63, a second layer 62 is formed. For instance, a GaN layer having a thickness of 350 nm is formed as the second layer 62. Formation of the first layer 61, the third layer 63, and the second layer 62 is repeated a plurality of times. Thus, the set of the first layer 61, the third layer 63, and the second layer 62 is stacked in a plurality. Accordingly, an intermediate layer 60 is formed on the second buffer unit 52.

On the intermediate layer 60, a foundation layer 70 is formed. For instance, an i-GaN layer having a thickness of 1000 nm is formed as the foundation layer 70.

Figure 18E:
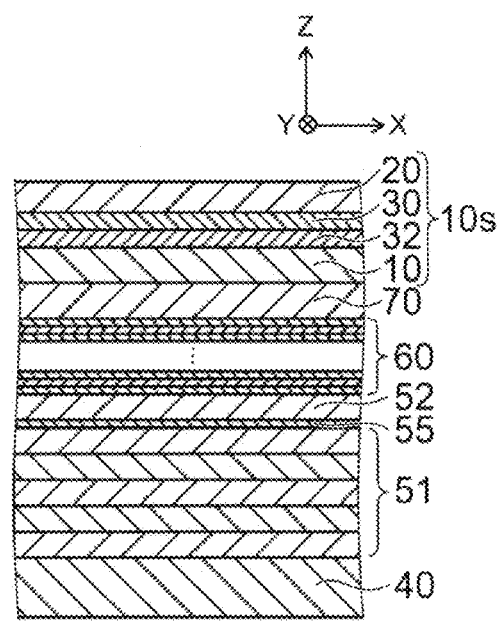

As shown in FIG. 18E, on the foundation layer 70, a first semiconductor layer 10 is formed. For instance, an n-type GaN layer having a thickness of 1000 nm is formed as the first semiconductor layer 10.

On the first semiconductor layer 10, a plurality of high bandgap energy layers 35 and low bandgap energy layers 36 are alternately stacked. The high bandgap energy layer 35 is e.g. a GaN layer. The low bandgap energy layer 36 is e.g. an InGaN layer. Thus, a stacked unit 32 is formed on the first semiconductor layer 10.

On the stacked unit 32, a plurality of barrier layers 33 and well layers 34 are alternately stacked. The barrier layer 33 is e.g. a GaN layer. The well layer 34 is e.g. an InGaN layer. Thus, a light emitting layer 30 is formed on the stacked unit 32.

On the light emitting layer 30, a second semiconductor layer 20 is formed. For instance, a p-type GaN layer having a thickness of 100 nm is formed as the second semiconductor layer 20. Thus, a functional layer 10s is formed on the foundation layer 70. An upper layer unit 15 including the second buffer unit 52, the intermediate layer 60, the foundation layer 70, and the functional layer 10s is formed on the silicon-containing unit 55.

Accordingly, the nitride semiconductor wafer 113 is completed.

In the embodiment, growth of semiconductor layers can be based on e.g. the metal-organic chemical vapor deposition (MOCVD) method, metal-organic vapor phase epitaxy (MOVPE) method, molecular beam epitaxy (MBE) method, and halide vapor phase epitaxy (HVPE) method.

For instance, in the case of using the MOCVD method or MOVPE method, the following materials can be used in forming each semiconductor layer. As a material of Ga, for instance, TMGa (trimethylgallium) and TEGa (triethylgallium) can be used. As a material of In, for instance, TMIn (trimethylindium) and TEIn (triethylindium) can be used. As a material of Al, for instance, TMAl (trimethylaluminum) can be used. As a material of N, for instance, $NH_3$ (ammonia), MMHy (monomethylhydrazine), and DMHy (dimethylhydrazine) can be used. As a material of Si, for instance, $SiH_4$ (monosilane) and $Si_2H_6$ (disilane) can be used.

Figure 19:
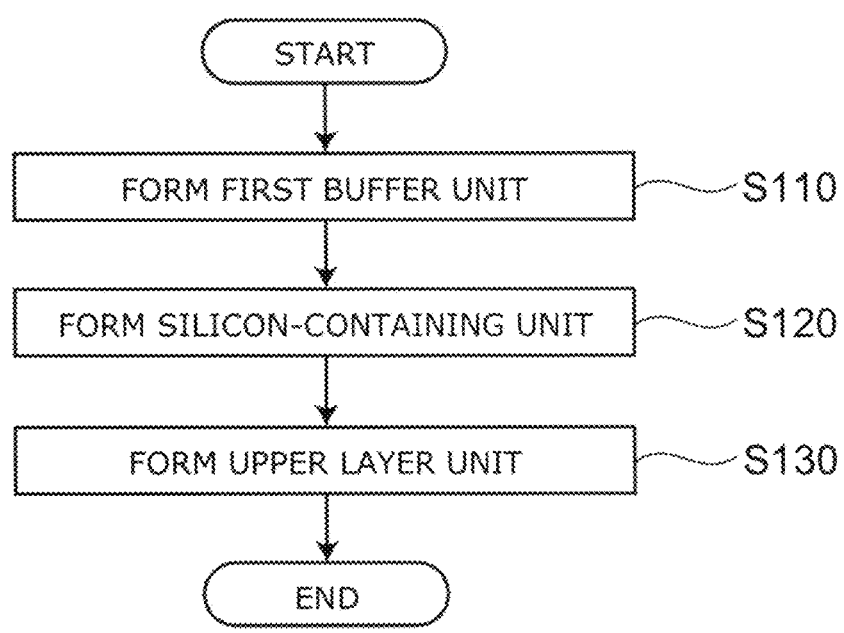
FIG. 19 is a flow chart showing the method for manufacturing a nitride semiconductor wafer according to the third embodiment.

FIG. 19 is a flow chart illustrating the method for manufacturing a nitride semiconductor wafer according to the third embodiment.

As shown in FIG. 19, the method for manufacturing a nitride semiconductor wafer according to the embodiment includes step S110 for forming a first buffer unit 51, step S120 for forming a silicon-containing unit 55, and step S130 for forming an upper layer unit 15.

In step S110, for instance, the processing described with reference to FIG. 18A is performed. In step S120, for instance, the processing described with reference to FIG. 18B is performed. In step S130, for instance, the processing described with reference to FIG. 18C to FIG. 18E is performed.

Thus, a nitride semiconductor wafer with suppressed cracks and reduced dislocation density is manufactured.

In a case where nitride semiconductor devices are manufactured from a nitride semiconductor wafer according to the embodiment having the functional layer 10s, at least a part of the silicon substrate and/or at least a part of the buffer section 50 can be removed, and the functional layer 10s and a remaining part of the silicon substrate and the buffer section 50 (if any) can be bonded to another substrate.

The embodiments provide a nitride semiconductor wafer, a nitride semiconductor device, and a method for manufacturing a nitride semiconductor wafer with suppressed cracks and reduced dislocation density. In this description, the "nitride semiconductor" includes semiconductors of the chemical formula $B_xIn_yAl_zGa_{1-x-y-z}N$ ($0 \leq x \leq 1$, $0 \leq y \leq 1$, $x+y+z \leq 1$) of any compositions with the composition ratios x, y, and z varied in the respective ranges. Furthermore, the "nitride semiconductor" also includes those of the above chemical formula further including group V elements other than N (nitrogen), those further including various elements added to control various material properties such as conductivity type, and those further including various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, any specific configurations of various components such as the silicon substrate, first buffer unit, silicon-containing unit, upper layer unit, second buffer unit, functional layer, impurity-containing layer, and first to n-th buffer layers included in the nitride semiconductor wafer and the nitride semiconductor device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

Moreover, all nitride semiconductor wafers, nitride semiconductor devices, and methods for manufacturing the nitride semiconductor wafers practicable by an appropriate design modification by one skilled in the art based on the nitride semiconductor wafers, nitride semiconductor devices, and methods for manufacturing the nitride semiconductor wafers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
a silicon substrate having a major surface;
a stacked multilayer unit formed on the major surface of the silicon substrate, the stacked multilayer unit including N number of buffer layers stacked in a stacking direction perpendicular to the major surface, the buffer layers including a nitride semiconductor, N being not less than two and not more than nine, the buffer layers including an i-th buffer layer (i being an integer of 1 or more and less than N), and an (i+1)-th buffer layer provided on the i-th buffer layer, the (i+1)-th buffer layer being in contact with the i-th buffer layer, the i-th buffer layer having an i-th lattice length Wi in a first direction parallel to the major surface, the (i+1)-th buffer layer having an (i+1)-th lattice length W(i+1) in the first direction, and a relation that $0.003 \leq (W(i+1)-Wi)/Wi \leq 0.008$ being satisfied for all the buffer layers;
a silicon-containing unit provided on the stacked multilayer unit and containing silicon, the silicon-containing unit being in contact with the stacked multilayer unit;
an upper layer unit provided on the silicon-containing unit and including a nitride semiconductor
wherein
the upper layer unit includes
an upper buffer layer provided on the silicon-containing unit and including a nitride semiconductor, and
a functional layer provided on the upper buffer layer and including a nitride semiconductor,
the functional layer includes an impurity-containing layer containing an impurity, and
an impurity concentration in the impurity-containing layer is higher than an impurity concentration in the upper buffer layer,
the upper layer unit further includes an intermediate layer provided between the upper buffer layer and the functional layer,
the intermediate layer includes
a first layer including a nitride semiconductor containing Al, and
a second layer provided on the first layer and including a nitride semiconductor,
an Al composition ratio of the second layer is lower than an Al composition of the first layer,
the intermediate layer further includes a third layer including a nitride semiconductor including Al and provided between the first layer and the second layer, and
an Al composition ratio of the third layer is lower than the Al composition ratio of the first layer and higher than the Al composition ratio of the second layer.

2. The device according to claim 1, wherein
one of the buffer layers has a first surface parallel to the major surface,
the first surface is a c-plane, and
the first direction is an a-axis direction.

3. The device according to claim 1, wherein
the buffer layers include a lower most buffer layer closest to the silicon substrate, and an upper most buffer layer closest to the silicon-containing unit,
the lower most buffer layer includes $Al_{x1}Ga_{1-x1}N$ ($0 < x1 \leq 1$),
the upper most buffer layer includes $Al_{xn}Ga_{1-xn}N$ ($0 \leq xn < x1$), and
the i-th buffer layer provided between the lower most buffer layer and the upper most layer includes $Al_{xi}Ga_{1-xi}N$ ($xn < xi < x1$).

4. The device according to claim 3, wherein an Al composition ratio in the (i+1)-th buffer layer is lower than an Al composition ratio in the i-th buffer layer.

5. The device according to claim 1, wherein a silicon concentration in the silicon-containing unit is $6.2 \times 10^{19}$ atoms/cm$^3$ or more and $4.0 \times 10^{20}$ atoms/cm$^3$ or less.

6. The device according to claim 1, wherein the upper buffer layer includes $Al_{x0}Ga_{1-x0}N$ ($0 \leq x0 < 1$).

7. The device according to claim 1, wherein the functional layer includes
a first semiconductor layer of a first conductivity type provided on the upper buffer layer,
a light emitting layer provided on the first semiconductor layer; and
a second semiconductor layer of a second conductivity type provided on the light emitting layer.

8. The device according to claim 1, wherein the upper layer unit further includes a foundation layer,
the foundation layer is provided between the upper buffer layer and the functional layer and includes a nitride semiconductor, and
a concentration of an impurity included in the foundation layer is lower than a concentration of an impurity included in the functional layer.

9. A method for manufacturing a nitride semiconductor wafer, comprising:
forming a stacked multilayer unit on a major surface of a silicon substrate, the stacked multilayer unit including N number of buffer layers stacked in a stacking direction perpendicular to the major surface, the stacked multilayer unit being in contact with the major surface, the buffer layers including a nitride semiconductor, N being not less than two and not more than nine, the buffer layers including an i-th buffer layer (i being an integer of 1 or more and less than N), and an (i+1)-th buffer layer provided on the i-th buffer layer, the (i+1)-th buffer layer being in contact with the i-th buffer layer, the i-th buffer layer having a i-th lattice length Wi in a first direction parallel to the major surface, the (i+1)-th buffer layer having a (i+1)-th lattice length W(i+1) in the first direction, and a relation that $0.003 \leq (W(i+1)-Wi)/Wi \leq 0.008$ being satisfied for all the buffer layers;

forming a silicon-containing unit containing silicon on the stacked multilayer unit, the silicon-containing unit being in contact with the stacked multilayer unit; and forming an upper layer unit including a nitride semiconductor on the silicon-containing unit, wherein the upper layer unit includes an upper buffer layer provided on the silicon-containing unit and including a nitride semiconductor, and a functional layer provided on the upper buffer layer and including a nitride semiconductor, the functional layer includes an impurity-containing layer containing an impurity, and an impurity concentration in the impurity-containing layer is higher than an impurity concentration in the upper buffer layer, the upper layer unit further includes an intermediate layer provided between the upper buffer layer and the functional layer, the intermediate layer includes a first layer including a nitride semiconductor containing Al, and a second layer provided on the first layer and including a nitride semiconductor, an Al composition ratio of the second layer is lower than an Al composition of the first layer, the intermediate layer further includes a third layer including a nitride semiconductor including Al and provided between the first layer and the second layer, and an Al composition ratio of the third layer is lower than the Al composition ratio of the first layer and higher than the Al composition ratio of the second layer.

10. The method according to claim 9, wherein the functional layer includes:

a third semiconductor layer provided on the upper buffer layer, and a fourth semiconductor layer provided on the third semiconductor layer to form a heterojunction with the third semiconductor layer, and wherein a bandgap of the fourth semiconductor layer is larger than a bandgap of the third semiconductor layer.

11. A nitride semiconductor wafer comprising:

a silicon substrate having a major surface;

a stacked multilayer unit provided on the major surface and including N number of buffer layers stacked in a stacking direction perpendicular to the major surface, the buffer layers including a nitride semiconductor, N being not less than two and not more than nine, the buffer layers including an i-th buffer layer (i being an integer of 1 or more and less than N), and an (i+1)-th buffer layer provided on the i-th buffer layer, the i-th buffer layer having an i-th lattice length Wi in a first direction parallel to the major surface, the (i+1)-th buffer layer having an (i+1)-th lattice length W(i+1) in the first direction, and a relation that $0.003 \leq (W(i+1)-Wi)/Wi \leq 0.008$ being satisfied for all the buffer layers;

a silicon-containing unit provided on the stacked multilayer unit and containing silicon; and an upper layer unit provided on the silicon-containing unit and including a nitride semiconductor, wherein:

the upper layer unit includes an upper buffer layer provided on the silicon-containing unit and including a nitride semiconductor, and a functional layer provided on the upper buffer layer and including a nitride semiconductor, the functional layer includes an impurity-containing layer containing an impurity, and an impurity concentration in the impurity-containing layer is higher than an impurity concentration in the upper buffer layer, the upper layer unit further includes an intermediate layer provided between the upper buffer layer and the functional layer, the intermediate layer includes a first layer including a nitride semiconductor containing Al, and a second layer provided on the first layer and including a nitride semiconductor, an Al composition ratio of the second layer is lower than an Al composition of the first layer, the intermediate layer further includes a third layer including a nitride semiconductor including Al and provided between the first layer and the second layer, and an Al composition ratio of the third layer is lower than the Al composition ratio of the first layer and higher than the Al composition ratio of the second layer.

12. The wafer according to claim 11, wherein one of the buffer layers has a first surface parallel to the major surface, the first surface is a c-plane, and the first direction is an a-axis direction.

13. The wafer according to claim 11, wherein the buffer layers include a lower most buffer layer closest to the silicon substrate, and an upper most buffer layer closest to the silicon-containing unit, the lower most buffer layer includes $Al_{x1}Ga_{1-x1}N$ ($0<x1\leq1$), the upper most buffer layer includes $Al_{xn}Ga_{1-xn}N$ ($0\leq xn<x1$), and the i-th buffer layer provided between the lower most buffer layer and the upper most layer includes $Al_{xi}Ga_{1-xi}N$ ($xn<xi<x1$).

14. The wafer according to claim 13, wherein an Al composition ratio in the (i+1)-th buffer layer is lower than an Al composition ratio in the i-th buffer layer.

15. The wafer according to claim 11, wherein a silicon concentration in the silicon-containing unit is $6.2\times10^{19}$ atoms/cm$^3$ or more and $4.0\times10^{20}$ atoms/cm$^3$ or less.

16. The wafer according to claim 11, wherein the upper buffer layer includes $Al_{x0}Ga_{1-x0}N$ ($0\leq x0<1$).

17. The wafer according to claim 11, wherein the functional layer includes a first semiconductor layer of a first conductivity type provided on the upper buffer layer, a light emitting layer provided on the first semiconductor layer, and a second semiconductor layer of a second conductivity type provided on the light emitting layer.

18. The wafer according to claim 11, wherein the upper layer unit further includes a foundation layer,
the foundation layer is provided between the upper buffer layer and the functional layer and includes a nitride semiconductor, and
a concentration of an impurity included in the foundation layer is lower than a concentration of an impurity included in the functional layer.

19. The wafer according to claim 11, wherein
the functional layer includes:
a third semiconductor layer provided on the upper buffer layer, and
a fourth semiconductor layer provided on the third semiconductor layer to form a heterojunction with the third semiconductor layer, and
a bandgap of the fourth semiconductor layer is larger than a bandgap of the third semiconductor layer.

20. The wafer according to claim 11, wherein
the stacked multilayer is in contact with the major surface, and
the (i+1)-th buffer layer is in contact with the i-th buffer layer.

* * * * *